(12) United States Patent
Kim et al.

(10) Patent No.: US 10,674,605 B2
(45) Date of Patent: Jun. 2, 2020

(54) HIGH RESOLUTION DISPLAY DEVICE

(71) Applicant: Samsung Display Co., Ltd., Yongin-Si, Gyeonggi-Do (KR)

(72) Inventors: Byoung Yong Kim, Seoul (KR); Jong Hyuk Lee, Seoul (KR); Jeong Ho Hwang, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/648,122

(22) Filed: Jul. 12, 2017

(65) Prior Publication Data

US 2018/0020543 A1 Jan. 18, 2018

(30) Foreign Application Priority Data

Jul. 13, 2016 (KR) .................. 10-2016-0088890

(51) Int. Cl.
*H05K 1/11* (2006.01)
*H05K 1/14* (2006.01)
(Continued)

(52) U.S. Cl.
CPC .......... *H05K 1/111* (2013.01); *G02F 1/13452* (2013.01); *G02F 1/13458* (2013.01); *G09G 3/20* (2013.01); *H01L 21/00* (2013.01); *H01L 27/3276* (2013.01); *H05K 1/028* (2013.01); *H05K 1/118* (2013.01); *H05K 1/144* (2013.01); *H05K 1/147* (2013.01); *H05K 1/181* (2013.01); *G09G 2300/0426* (2013.01); *H01L 27/124* (2013.01); *H01L 51/0097* (2013.01); *H01L 2251/5338* (2013.01); *H05K 2201/041* (2013.01); *H05K 2201/09409* (2013.01); *H05K 2201/09709* (2013.01); *H05K 2201/10128* (2013.01); *H05K 2201/10136* (2013.01)

(58) Field of Classification Search
CPC ...... H05K 1/111; H05K 1/028; G02F 1/13452
See application file for complete search history.

(56) References Cited

U.S. PATENT DOCUMENTS

2011/0199569 A1* 8/2011 Matsui .................. G02F 1/1345
349/151
2012/0211772 A1* 8/2012 Moh .................... H01L 27/0288
257/88
(Continued)

FOREIGN PATENT DOCUMENTS

| JP | 2011-187217 A | 9/2011 |
| KR | 10-2008-0078202 A | 8/2008 |
| KR | 10-2014-0021787 A | 2/2014 |

OTHER PUBLICATIONS

Extended European Search Report for application No. 17181099.7, dated Jan. 10, 2018 (15 pages).

*Primary Examiner* — William H. Mayo, III
*Assistant Examiner* — Hiram E Gonzalez
(74) *Attorney, Agent, or Firm* — Innovation Counsel LLP

(57) ABSTRACT

A display device according to an exemplary embodiment includes: a substrate including a display region configured to display an image, and a pad region positioned around the display region; and a first pad unit positioned on the pad region, wherein the first pad unit includes a first terminal region including a plurality of first pad terminals arranged in a first pattern, and a second terminal region including a plurality of second pad terminals arranged in a second pattern different from the first pattern.

29 Claims, 21 Drawing Sheets

(51) Int. Cl.
*G02F 1/1345* (2006.01)
*H01L 27/32* (2006.01)
*H05K 1/02* (2006.01)
*H05K 1/18* (2006.01)
*H01L 27/12* (2006.01)
*H01L 51/00* (2006.01)
*G09G 3/20* (2006.01)
*H01L 21/00* (2006.01)

(56) References Cited

U.S. PATENT DOCUMENTS

| | | |
|---|---|---|
| 2014/0307396 A1* | 10/2014 | Lee ................ H05K 1/028 361/749 |
| 2016/0048619 A1 | 2/2016 | Dalton |
| 2016/0055777 A1 | 2/2016 | Kim |
| 2016/0066409 A1 | 3/2016 | Kwon et al. |

* cited by examiner

HIGH RESOLUTION DISPLAY DEVICE

CROSS-REFERENCE TO RELATED APPLICATION

This application claims priority to, and the benefit of, Korean Patent Application No. 10-2016-0088890 filed in the Korean Intellectual Property Office on Jul. 13, 2016, the entire contents of which are incorporated herein by reference.

BACKGROUND

(a) Technical Field

The present disclosure relates generally to display devices. More specifically, the present disclosure relates to high resolution display devices.

(b) Description of the Related Art

Display devices which are currently known include a liquid crystal display (LCD), a plasma display panel (PDP), an organic light emitting diode display (OLED display), a field effect display (FED), an electrophoretic display device, and the like.

Particularly, the organic light emitting diode display includes two electrodes and an organic emission layer positioned therebetween, wherein an electron injected from one electrode and a hole injected from the other electrode are coupled with each other in the organic emission layer to generate an exciton, and the exciton emits energy to emit light.

Since the organic light emitting diode display has a self-luminance characteristic and does not require a separate light source, unlike the LCD, a thickness and a weight thereof may be reduced. Further, since the organic light emitting diode display has desirable characteristics such as low power consumption, high luminance, and a high response speed, the OLED display receives attention as a next-generation display device.

To drive the organic light emitting element of the organic light emitting diode display, a printed circuit board (PCB) is bonded to a peripheral area of the substrate and driving signals are transmitted through the printed circuit board (PCB).

However, as display resolution increases, the number of pad terminals bonded with the printed circuit board (PCB) also increases. Accordingly, a size of the peripheral area in which the pad terminal is disposed is increased such that the display region shrinks, and if resistance of wiring connected to some pad terminals increases, luminance of the display device is reduced.

The above information disclosed in this Background section is only for enhancement of understanding of the background of the invention and therefore it may contain information that does not form the prior art that is already known in this country to a person of ordinary skill in the art.

SUMMARY

Embodiments of the present invention provide a display device capable of disposing many pad terminals in the peripheral area.

Also, embodiments of the present invention provide a display device preventing luminance reduction due to resistance increase in the wiring positioned near the pad terminal.

A display device according to an exemplary embodiment includes: a substrate including a display region configured to display an image and a pad region positioned around the display region; and a first pad unit positioned on the pad region. The first pad unit includes a first terminal region including a plurality of first pad terminals arranged in a first pattern, and a second terminal region including a plurality of second pad terminals arranged in a second pattern different from the first pattern.

The first terminal region and the second terminal region may be arranged along a first direction.

The plurality of first pad terminals may include: a plurality of first column sub-pad terminals arranged substantially along a first line forming a first inclination angle with the first direction; a plurality of second column sub-pad terminals arranged substantially along a second line, separated from the plurality of first column sub-pad terminals, the second line forming a second inclination angle with the first line; and a plurality of first terminal connection lines each connecting one among the plurality of first column sub-pad terminals and one among the plurality of second column sub-pad terminals, each first terminal connection line having a shape with at least one bend.

The first inclination angle and the second inclination angle may be substantially equal.

The first inclination angle and the second inclination angle may each be between 0 degrees and 90 degrees.

A plurality of first column sub-pad terminals and a plurality of second column sub-pad terminals may each have a quadrangular shape.

The quadrangular shape may include a first side parallel to the first direction and a second side adjacent to the first side and parallel to the second direction, and the second side may be longer than the first side.

At least one first dummy pad terminal may be disposed between a pair of adjacent first column sub-pad terminals.

The first column sub-pad terminals and at least one first dummy pad terminal may be arranged along a same line.

At least one second dummy pad terminal may be disposed between a pair of adjacent second column sub-pad terminals.

The second column sub-pad terminals and at least one second dummy pad terminal may be arranged along a same line.

The second terminal region may include two regions disposed at two sides of the first terminal region.

The first terminal region may include two regions disposed at two sides of the second terminal region.

The plurality of second pad terminals may respectively include a pair of second sub-pad terminals separated from each other, and a substantially straight second terminal connection line connecting the pair of second sub-pad terminals to each other.

The pair of second sub-pad terminals may be arranged along one line.

The pair of second sub-pad terminals may be arranged along a second direction perpendicular to the first direction.

The pair of second sub-pad terminals may be arranged along a line oriented at a third inclination angle with respect to the first direction.

The third inclination angle may be between 0 degrees and 90 degrees.

A base film, and a printed circuit board (PCB) positioned at one side of the base film and including a second pad unit with a shape corresponding to the first pad unit and bonded to the first pad unit, may be further included.

The second pad unit may include a third terminal region including a plurality of third pad terminals arranged in a third pattern corresponding to the first pattern, and a fourth terminal region including a plurality of fourth pad terminals arranged in a fourth pattern corresponding to the second pattern.

The plurality of third pad terminals may respectively include a plurality of third column sub-pad terminals arranged substantially along a third line forming the first inclination angle with the first direction, and a plurality of fourth column sub-pad terminals separated from the plurality of third column sub-pad terminals, and arranged substantially along a fourth line forming the second inclination angle with the first direction.

The fourth terminal region may be positioned at both sides of the third terminal region.

The fourth terminal region may be positioned between a pair of the third terminal regions.

The plurality of fourth pad terminals may respectively include a pair of fourth sub-pad terminals separated from each other.

The pair of fourth sub-pad terminals may be arranged along one line.

The one line may form the third inclination angle with the first direction, and the another side of the base film being different from the one side of the base film.

The printed circuit board (PCB) may further include a driving chip positioned at another side of the base film.

The base film may be flexible.

The first pad terminals may be connected to respective ones of the data lines disposed in the display region.

The second pad terminals may be respectively connected to power lines disposed in the display region.

The power lines may include at least one among a driving voltage line, a common power line, an initialization power line, and a gate line.

According to the above-described display device, a large number of the pad terminals may be disposed in the peripheral area.

Also, a reduction in luminance due to a resistance increase of the wiring around the pad terminal may be prevented.

DETAILED DESCRIPTION OF THE EMBODIMENTS

Figure 1:
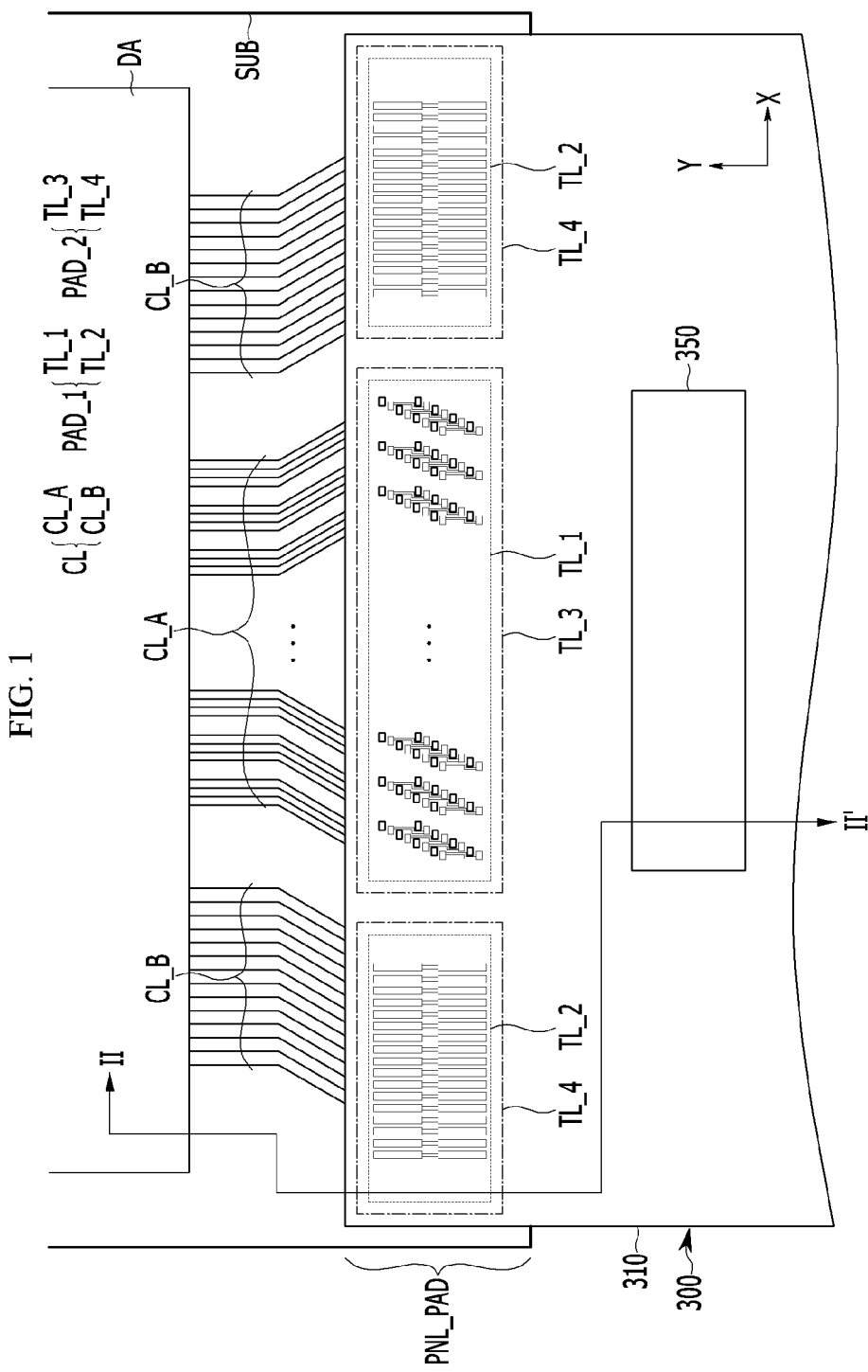
FIG. 1 is a schematic top plan view of a display device according to an exemplary embodiment.

Hereinafter, exemplary embodiments will be described in detail so as to be easily practiced by a person skilled in the art to which the present invention pertains, with reference to the accompanying drawings. As those skilled in the art would realize, the described embodiments may be modified in various different ways, all without departing from the spirit or scope. The drawings and description are to be regarded as illustrative in nature and not restrictive. Like reference numerals designate like elements throughout the specification.

In addition, the size and thickness of each component shown in the drawings are arbitrarily shown for better understanding and ease of description, but the present invention is not limited thereto.

In the drawings, the thickness of layers, films, panels, regions, etc., are exaggerated for clarity. In the drawings, for better understanding and ease of description, the thickness of some layers and areas is exaggerated. The drawings are thus not to scale. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Furthermore, when the first part is described as being arranged "on" the second part, this indicates that the first part is arranged at an upper side or a lower side of the second part without the limitation to the upper side thereof on the basis of the gravity direction.

All numerical values are approximate, and may vary. All examples of specific materials and compositions are to be taken as non-limiting and exemplary only. Other suitable materials and compositions may be used instead.

Now, a display device according to an exemplary embodiment will be described with reference to FIG. 1 and FIG. 2.

Figure 2:
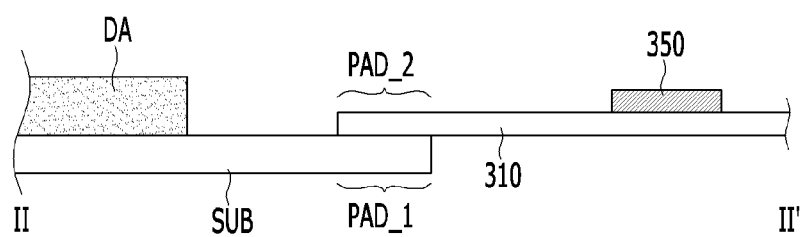
FIG. 2 is a cross-sectional view taken along a line II-II' of FIG. 1.

FIG. 1 is a schematic top plan view of a display device according to an exemplary embodiment, and FIG. 2 is a cross-sectional view taken along a line II-II' of FIG. 1.

Referring to FIG. 1 and FIG. 2, the display device according to the present exemplary embodiment may include a substrate SUB, a first pad unit PAD_1, and a printed circuit board (PCB) 300. In the present exemplary embodiment, a first terminal region TL_1 and a second terminal region TL_2 are formed at a first pad unit PAD_1 of the printed circuit board (PCB) 300, and a plurality of first pad terminals PAD_TL_A (referring to FIG. 5) disposed at the first terminal region TL_1 and a plurality of second pad terminals PAD_TL_B (referring to FIG. 5) disposed at the second terminal region TL_2 may be formed with different patterns.

Referring to FIG. 1 and FIG. 2, the display device according to the present exemplary embodiment may include a display region DA and a pad region PNL_PAD. The display region DA and the pad region PNL_PAD represent a region positioned on the substrate SUB.

The display region DA is a region displaying an image, and a display panel 100 (referring to FIG. 3) emitting light may be disposed in the display region DA. The display panel 100 will be described further below.

The pad region PNL_PAD is a region positioned around the display region DA, and the pad region PNL_PAD may be bonded with the printed circuit board (PCB) 300 so as to transmit signals from an external source. The first pad unit PAD_1 is disposed in the pad region PNL_PAD, thereby the first pad unit PAD_1 and the printed circuit board (PCB) 300 may be electrically coupled.

In this case, the first pad unit PAD_1 may include a first terminal region TL_1 and a second terminal region TL_2. The first terminal region TL_1 and the second terminal region TL_2 represent a region positioned on the substrate SUB.

A plurality of first pad terminals PAD_TL_A (referring to FIG. 5) may be disposed in the first terminal region TL_1, and a plurality of second pad terminals PAD_TL_B (referring to FIG. 6) may be disposed in the second terminal region TL_2. The plurality of first pad terminals PAD_TL_A may be disposed with a first pattern in the first terminal region TL_1. Also, the plurality of second pad terminals PAD_TL_B may be disposed in the second terminal region TL_2 with the second pattern that is different from the first pattern. Here, the pattern represents a shape in which the pad terminals in the first terminal region TL_1 and the second terminal region TL_2 are disposed.

That is, according to the present exemplary embodiment, the plurality of first pad terminals PAD_TL_A and the plurality of second pad terminals PAD_TL_B may be disposed with different shapes in the first terminal region TL_1 and the second terminal region TL_2. The structure of the first terminal region TL_1 and the second terminal region TL_2 is described in further detail below.

The first terminal region TL_1 and the second terminal region TL_2 of the pad region PNL_PAD may be disposed in parallel in the first direction. In this case, the pad region PNL_PAD may be disposed to be separated from the display region DA in the second direction. Hereafter, an X-axis and a Y-axis representing coordinates in the drawing represent the first direction and the second direction, respectively.

Figure 21:
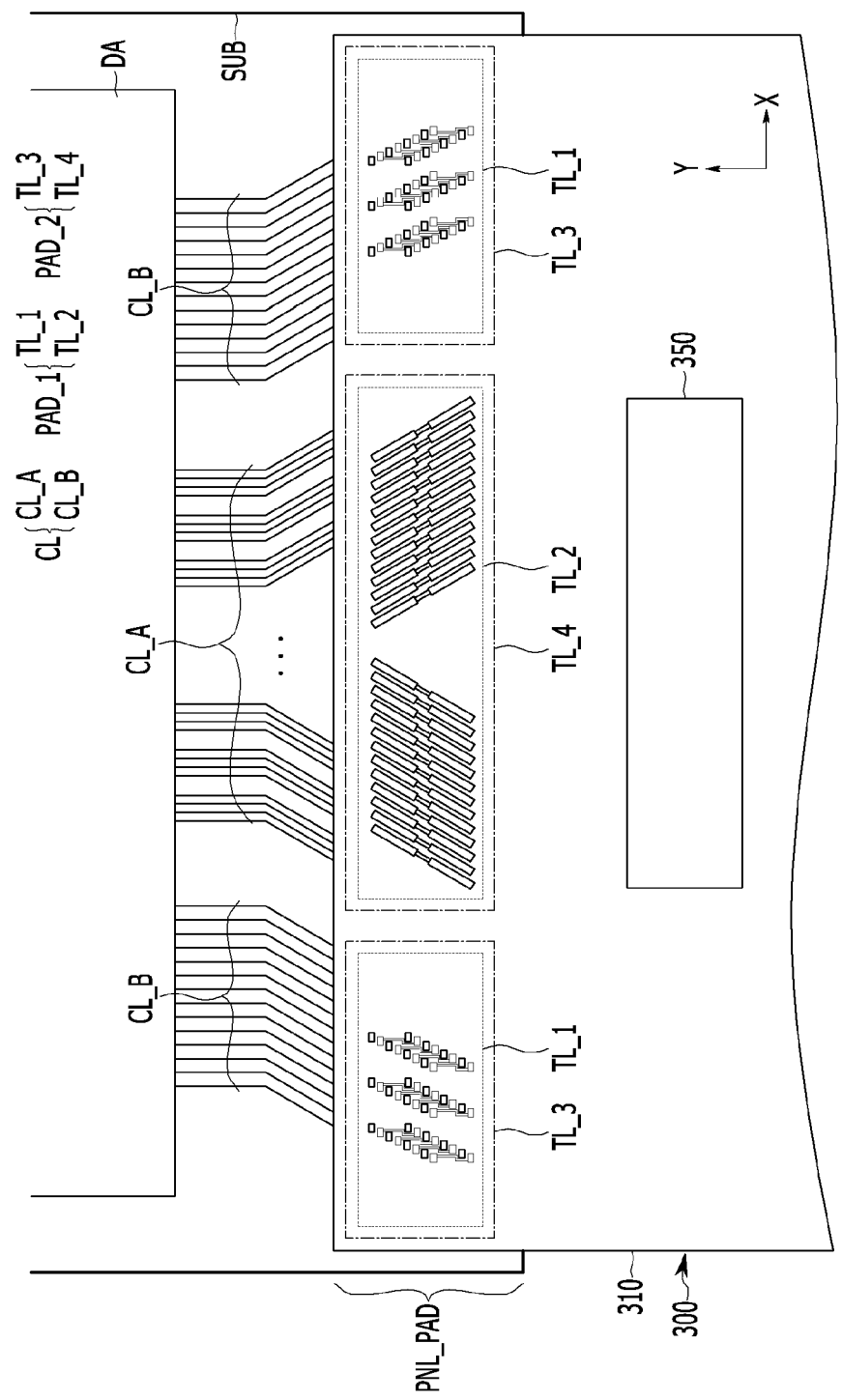
FIG. 21 is a view of an exemplary variation of the display device of FIG. 1.

In the present exemplary embodiment, as shown in FIG. 1, the second terminal region TL_2 may be positioned at both sides of the first terminal region TL_1. However, the arrangement structure of the first terminal region TL_1 and the second terminal region TL_2 is not limited thereto, and like an exemplary variation shown in FIG. 21, the second terminal region TL_2 may be disposed between a pair of first terminal regions TL_1.

Connection wiring CL is positioned between the display region DA and the pad region PNL_PAD, and the display region DA and the pad region PNL_PAD may be connected by the connection wiring CL. The connection wiring CL may be connected to a plurality of signal lines disposed in the display region DA. Also, the connection wiring CL may be connected with the first pad terminals PAD_TL_A of the pad region PNL_PAD and the plurality of second pad terminals PAD_TL_B.

In this case, the connection wiring CL may include first connection wiring CL_A and second connection wiring CL_B. The first connection wiring CL_A may connect the display region DA and the first terminal region TL_1 to each other, and the second connection wiring CL_B may connect the display region DA and the second terminal region TL_2 to each other.

The printed circuit board (PCB) 300 is bonded to the first pad unit PAD_1 of the pad region PNL_PAD of the substrate SUB, thereby transmitting the signal required for driving the display panel 100. A driving chip 350 may be mounted on a base film 310 of the printed circuit board (PCB) 300, and the driving chip 350 may be used for driving the display panel 100.

In this case, in the printed circuit board (PCB) 300, a second pad unit PAD_2 is formed at one end of the base film 310, and the second pad unit PAD_2 may be bonded to the first pad unit PAD_1 of the substrate SUB. The second pad unit PAD_2 may be disposed to face the first pad unit PAD_1.

The second pad unit PAD_2 may include a third terminal region TL_3 and a fourth terminal region TL_4. The third terminal region TL_3 and the fourth terminal region TL_4 represent a region positioned on the base film 310.

In the third terminal region TL_3, a plurality of third pad terminals PAD_TL_C (referring to FIG. 10) may be disposed, and a plurality of fourth pad terminals PDA_TL_D (referring to FIG. 12) may be disposed in the fourth terminal region TL_4.

The plurality of third pad terminals PAD_TL_C may be formed of a third pattern corresponding to the above-described first pattern, in the third terminal region TL_3. In this case, the third pattern may have a shape that is the same as or similar to the first pattern. Also, the plurality of fourth pad terminals PAD_TL_D may be formed of a fourth pattern corresponding to the above-described second pattern, in the fourth terminal region TL_4. In this case, the fourth pattern may have a shape that is the same as or similar to the second pattern.

That is, according to the present exemplary embodiment, the second pad unit PAD_2 of the printed circuit board (PCB) 300 may be formed in a shape corresponding to the first pad unit PAD_1 of the substrate SUB. That is, the plurality of pad terminals disposed in the second pad unit PAD_2 may be disposed in a pattern that is the same as or similar to that of the first pad unit PAD_1. The structure of the third terminal region TL_3 and the fourth terminal region TL_4 will be described in further detail below.

Next, the display panel 100 formed in the display region DA will be described with reference to FIG. 3 and FIG. 4.

Figure 3:
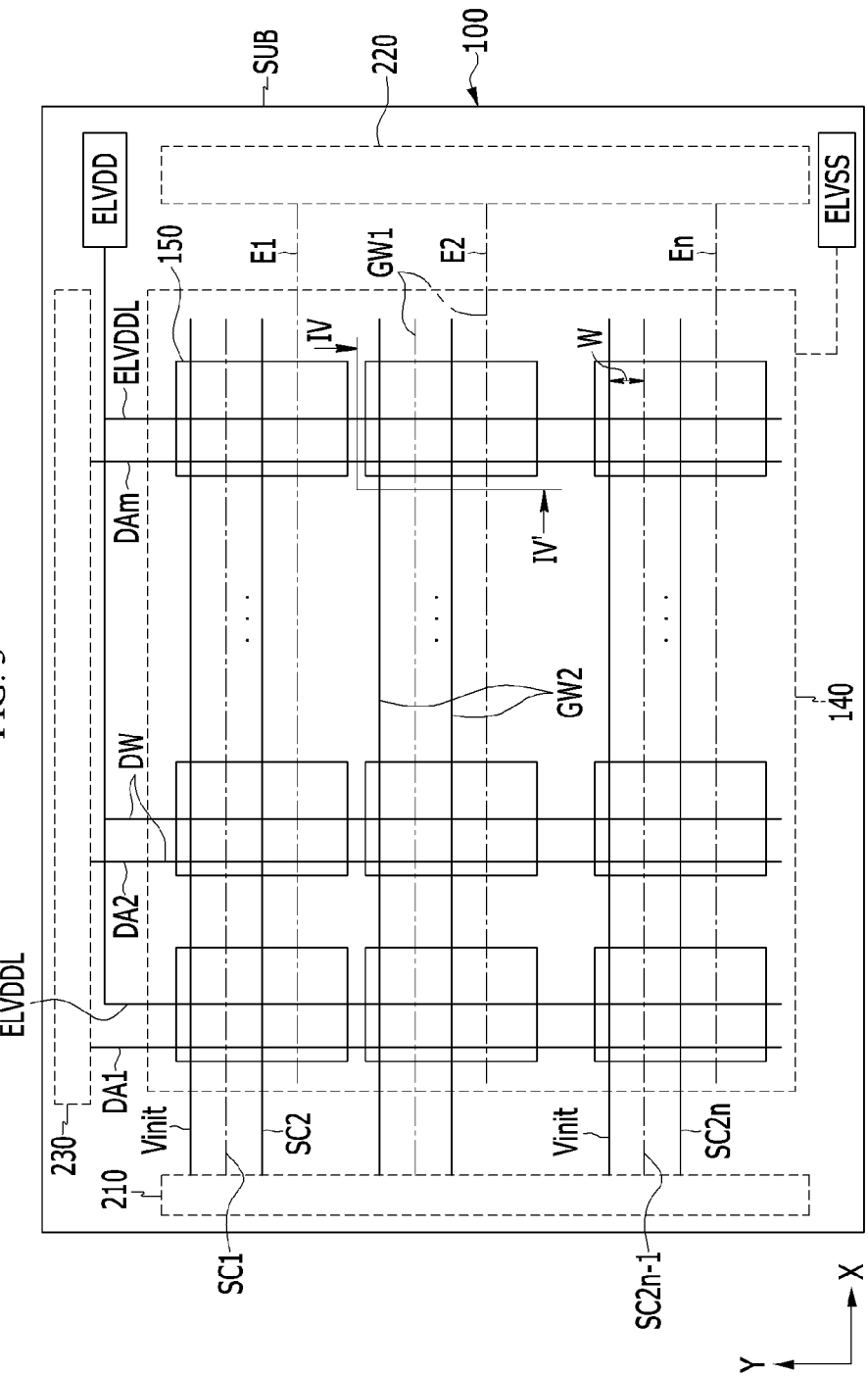
FIG. 3 is a schematic view showing a display region of FIG. 1.
Figure 4:
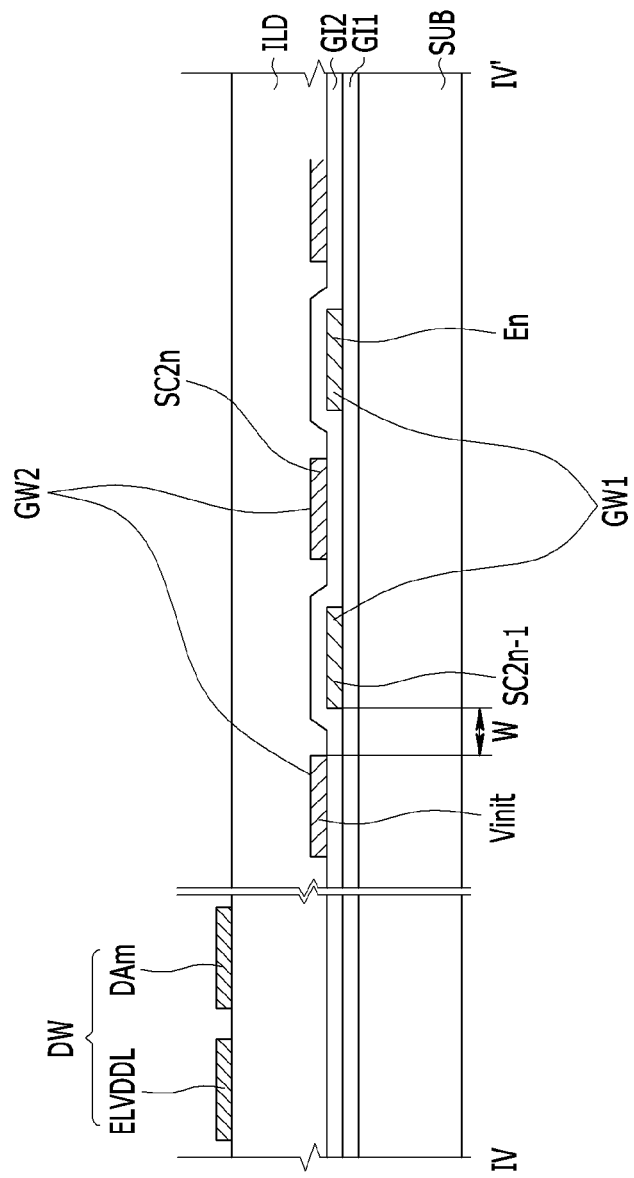
FIG. 4 is a cross-sectional view taken along a line IV-IV of FIG. 3.

FIG. 3 is a schematic view showing a display region of FIG. 1, and FIG. 4 is a cross-sectional view taken along a line IV-IV of FIG. 3.

According to the present exemplary embodiment, the display panel 100 includes first gate wires GW1, second gate wires GW2, data wires DW, a display unit 140, and a pixel 150.

A gate driver 210 sequentially supplies a scan signal to a first scan lines SC2-SC2n or second scan lines SC1-SC2n-1 included in the first gate wires GW1 and the second gate wires GW2, in response to a control signal supplied from an external control circuit (not shown), for example, a timing controller. Here, n is an integer of 1 or more.

Thus, the pixels 150 are selected by a scan signal, thereby sequentially receiving a data signal. In this case, the gate driver 210 shown in FIG. 3 may be formed in the driving chip 350 on the printed circuit board (PCB) 300, but for convenience of description, just the gate driver 210 is shown in FIG. 3.

The first gate wires GW1 are positioned on the substrate SUB with a first insulating layer GI1 interposed thereunder, and extend in the first direction. The first gate wires GW1 include a second scan line SC2n-1 and a light emission control line En.

The second scan line SC2n-1 is connected to the gate driver 210 and is supplied with the scan signal from the gate driver 210. The light emission control line En is connected to a light emission control driver 220, and is supplied with the light emission control signal from the light emission control driver 220. In this case, the light emission control driver 220 shown in FIG. 3 may be formed within the driving chip 350 on the printed circuit board (PCB) 300 like the gate driver 210, but for convenience of description, just the light emission control driver 220 is shown in FIG. 3.

The second gate wires GW2 are positioned on the first gate wires GW1 via a second insulating layer GI2 interposed therebetween, and extend in the first direction. The second gate wires GW2 include a first scan line SC2n and an initialization power line Vinit.

The first gate wires GW1 and the second gate wires GW2 do not overlap each other, but are instead placed in alternating order.

The first scan line SC2n is connected to the gate driver 210 and is supplied with the scan signal from the gate driver 210. The initialization power line Vinit is connected to the gate driver 210 and receives initialization power from the gate driver 210.

In an exemplary embodiment, the initialization power line Vinit receives initialization power from the gate driver 210, however the initialization power line Vinit may be connected to an additional configuration to receive initialization power from the additional configuration.

The light emission control driver 220 sequentially supplies the light emission control signal to the light emission control line En in response to a control signal supplied from an external component such as a timing controller. Thus, the emission of the pixel 150 is controlled by the light emission control signal.

That is, the light emission control signal controls an emission time of the pixel 150. However, the light emission control driver 220 may be omitted depending on the configuration of the pixel 150.

A data driver 230 supplies the data signal to the data line DAm among the data wires DW, in response to a control signal supplied from an external component such as a timing controller. The data signal supplied to the data line DAm is supplied to the pixel 150 selected by the scan signal whenever the scan signal is supplied to a particular scan line SC. Thus, the pixel 150 charges the voltage corresponding to the data signal and emits a luminance corresponding thereto.

Here, the data driver 230 shown in FIG. 3 may be formed in the driving chip 350 on the printed circuit board (PCB) 300, but for convenience of explanation, only the data driver 230 is shown in FIG. 3.

The data wires DW are positioned on the second gate wires GW2 via the third insulating layer ILD interposed therebetween, and extend in the second direction crossing the first direction. The data wires DW include data lines DA1-DAm and a driving power line ELVDDL. Each data line DAm is connected to the data driver 230 and receives data signals from the data driver 230. The driving power line ELVDDL is connected to an external first power source ELVDD that will be described later, and receives driving power from the first power source ELVDD.

In this case, the driving power line ELVDDL and the data line DAm may be formed from, or on, the same layer on the third insulating layer ILD. However, the present invention is not limited thereto, and the driving power line ELVDDL and the data line DAm may be formed from, or on, different layers.

For example, the driving power line ELVDDL may be formed from the same layer as the first gate wire GW1, and the data line DAm may be formed from the same layer as the second gate wire GW2. In contrast, the driving power line ELVDDL may be formed from the same layer as the second gate wire GW2, and the data line DAm may be formed from the same layer as the first gate wire GW1.

The display unit 140 includes a plurality of pixels 150 positioned crossings of the first gate wires GW1, the second gate wires GW2, and the data wires DW. Here, each pixel 150 includes an organic light emitting element that emits light of a luminance corresponding to a driving current corresponding to the data signal, and a pixel circuit to control the driving current flowing to the organic light emitting element.

The pixel circuit is respectively connected to the first gate wires GW1, the second gate wires GW2, and the data wires DW, and the organic light emitting element is connected to the pixel circuit. The pixel 150 is described as an organic light emitting element, however the pixel 150 applied to the display device of the present exemplary embodiment is not limited thereto, and it may be for example a liquid crystal display element or an electrophoretic display element.

The organic light emitting element of the display unit 140 is connected to the external first power source ELVDD via the pixel circuit interposed therebetween, and is also connected to a second power source ELVSS. The first power source ELVDD and the second power source ELVSS respectively supply driving power and common power to the pixel 150 of the display unit 140, and the pixel 150 emits light with a luminance corresponding to the driving current from the first power source ELVDD and the common power source.

As described above, in the display device according to an exemplary embodiment, the first gate wires GW1 and the second gate wires GW2 transverse the pixel 150 in the first direction and do not overlap each other. They are not positioned at the same layer either, but instead the first gate wires GW1 and the second gate wires GW2 are respectively positioned at different layers from each other via the second insulating layer GI2, and accordingly a distance W between adjacent gate wires may be decreased, thereby forming more pixels 150 in the same area. That is, a high resolution display device may be formed.

Next, the structure of the first pad terminals PAD_TL_A disposed in the first terminal region TL_1 will be described with reference to FIG. 5.

Figure 5:
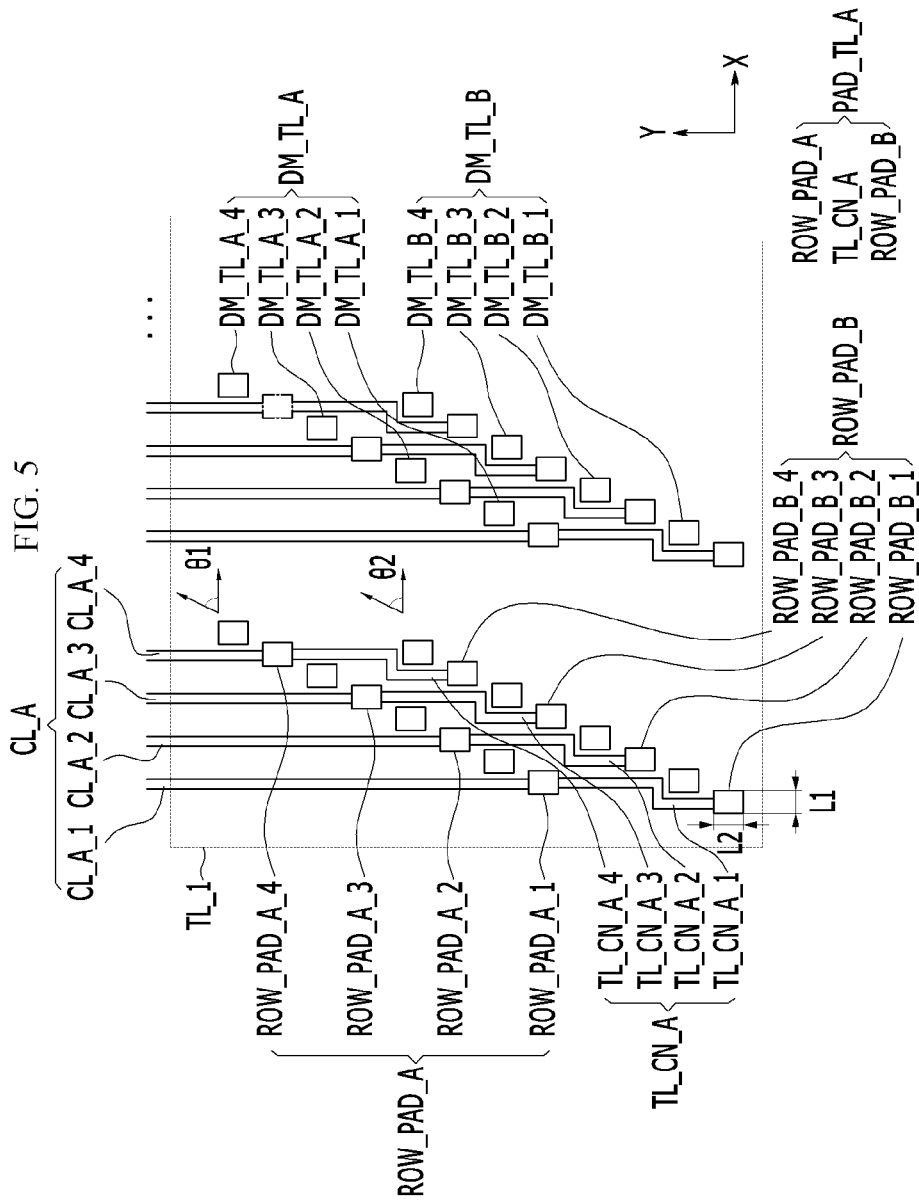
FIG. 5 is an enlarged view of a first terminal region of FIG. 1.

FIG. 5 is an enlarged view of a first terminal region of FIG. 1.

Referring to FIG. 5, a plurality of first pad terminals PAD_TL_A may be disposed in the first terminal region TL_1. In this case, the first terminal region TL_1 may be connected to the data wires DW of the display region DA through the first connection wiring CL_A. The plurality of first pad terminals PAD_TL_A may be disposed to be separated by a predetermined interval in the first direction within the first terminal region TL_1.

The plurality of first pad terminals PAD_TL_A may respectively include first column sub-pad terminals ROW_PAD_A, second column sub-pad terminals ROW_PAD_B, and first terminal connection lines TL_CN_A.

In the present exemplary embodiment, the first column sub-pad terminals ROW_PAD_A may be disposed to be separated from each other in one direction. In this case, first column sub-pad terminals ROW_PAD_A may form a first inclination angle $\theta1$ with the first direction. That is, the first column sub-pad terminals ROW_PAD_A may be arranged along a line that is inclined at the first inclination angle $\theta1$ with respect to the first direction. The first inclination angle $\theta1$ may be in a range of 0 degrees-90 degrees (excluding 0 degrees and 90 degrees).

Meanwhile, the first column sub-pad terminals ROW_PAD_A disposed in the first terminal region TL_1 may be disposed to be inclined in the same direction. That is, the first column sub-pad terminals ROW_PAD_A may be inclined at the same angle with respect to the X-axis, in the first terminal region TL_1. For example, as shown in FIG. 1, the first column sub-pad terminals ROW_PAD_A may be inclined at an approximate 1 o'clock direction.

Figure 8:
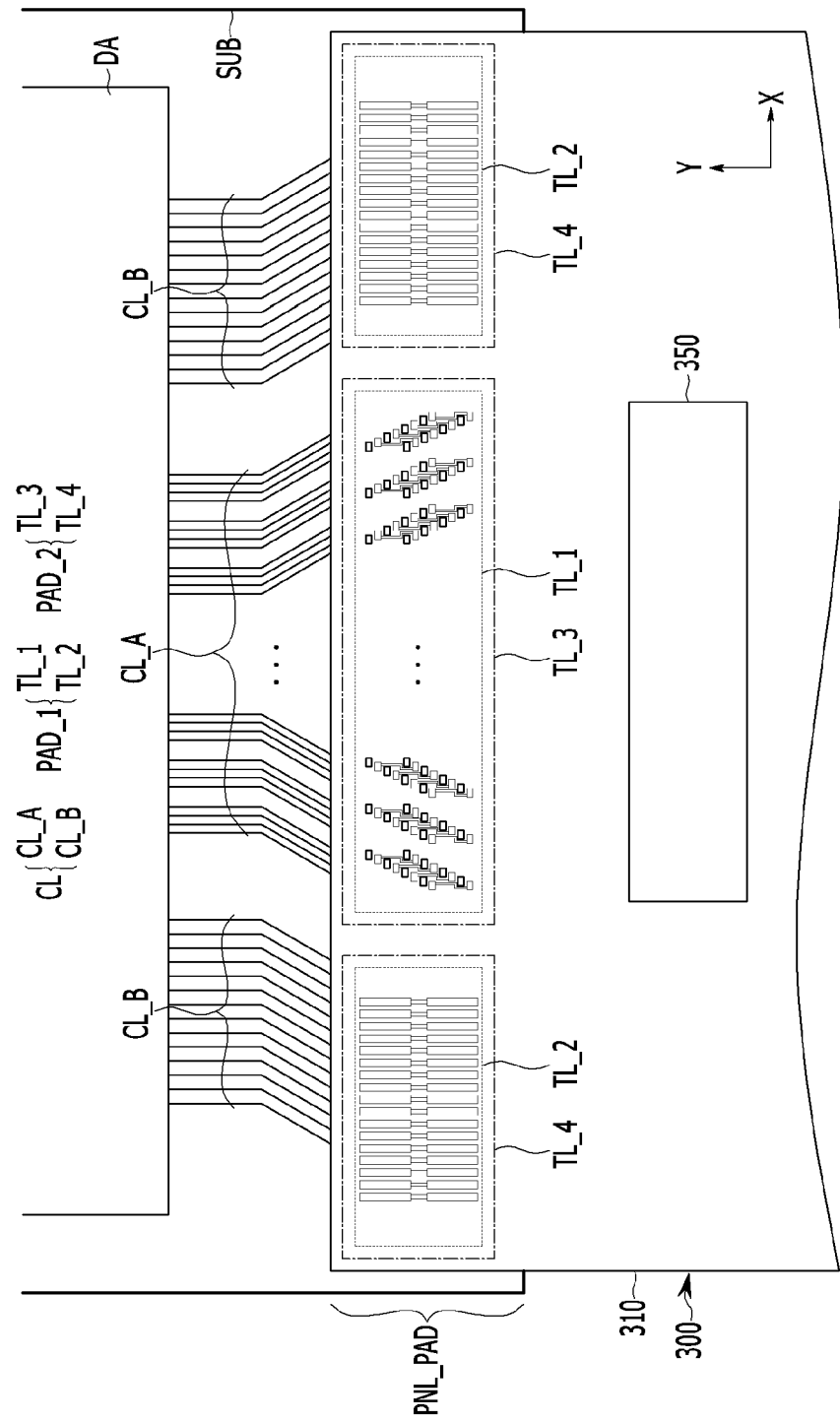
FIG. 8 is a view of an exemplary variation of a first terminal region of FIG. 1.

However, embodiments are not limited thereto, and as shown in FIG. 8, a part of the first column sub-pad terminals ROW_PAD_A disposed in the first terminal region TL_1 may be disposed to be inclined in an approximate 11 o'clock direction. In this case, the rest of the first column sub-pad terminals ROW_PAD_A may be disposed to be inclined in the approximate 1 o'clock direction.

Meanwhile, the interval between adjacent first column sub-pad terminals ROW_PAD_A may be constant. For example, the interval between the first column sub-pad terminal ROW_PAD_A_1 and the first column sub-pad terminal ROW_PAD_A_2, the interval between the first column sub-pad terminal ROW_PAD_A_2 and the first column sub-pad terminal ROW_PAD_A_3, and the interval between the first column sub-pad terminal ROW_PAD_A_3 and the first column sub-pad terminal ROW_PAD_A_4 may be the same. The first column sub-pad terminals ROW_PAD_A may be formed with an approximate quadrangular shape.

The second column sub-pad terminals ROW_PAD_B may be disposed to be separated from the first column sub-pad terminals ROW_PAD_A in the second direction. Like the first column sub-pad terminals ROW_PAD_A, the second column sub-pad terminals ROW_PAD_B may be disposed to be separated from each other in one direction.

In this case, the second column sub-pad terminals ROW_PAD_B may form a second inclination angle $\theta2$ with the first direction. That is, the second column sub-pad terminals ROW_PAD_B may be arranged along a line that is inclined at the second inclination angle $\theta2$ with respect to the first direction. The second inclination angle $\theta2$ may be in the range of 0 degrees-90 degrees (excluding 0 degrees and 90 degrees). Meanwhile, the second column sub-pad terminals ROW_PAD_B disposed in the first terminal region TL_1 may be disposed to be inclined in the same direction, like the first column sub-pad terminals ROW_PAD_A. That is, the second column sub-pad terminals ROW_PAD_B may be disposed to be inclined at the same angle with respect to the X-axis within the first terminal region TL_1. For example, as shown in FIG. 1, the second column sub-pad terminals ROW_PAD_B may be disposed to be inclined at an approximate 1 o'clock direction.

However, embodiments are not limited thereto, and as shown in FIG. 8, part of the second column sub-pad terminals ROW_PAD_B disposed in the first terminal region TL_1 may be disposed to be inclined at an approximate 11 o'clock direction. In this case, the rest of the second column sub-pad terminals ROW_PAD_B may be disposed in the approximate 1 o'clock direction.

In the present exemplary embodiment, the first inclination angle $\theta1$ and the second inclination angle $\theta2$ may be equal. Accordingly, the first column sub-pad terminals ROW_PAD_A and the second column sub-pad terminals ROW_PAD_B may be disposed to be inclined at the same angle with respect to the first direction. However, the present invention is not limited thereto, and the first inclination angle $\theta1$ and the second inclination angle $\theta2$ may be different from each other. Accordingly, the first column sub-pad terminals ROW_PAD_A and the second column sub-pad terminals ROW_PAD_B may be arranged to be inclined at different angles from each other with respect to the first direction.

Meanwhile, referring to FIG. 1 and FIG. 5, the plurality of first pad terminals PAD_TL_A disposed in the first terminal region TL_1 may be disposed to be inclined in the same direction. That is, the first column sub-pad terminals ROW_PAD_A and the second column sub-pad terminals ROW_PAD_B, making up the plurality of first pad terminals PAD_TL_A, may all be disposed to be inclined at the same angle with respect to the X-axis.

However, embodiments are not limited thereto, and as shown in FIG. 8, a plurality of first pad terminals PAD_TL_A disposed in the first terminal region TL_1 may be disposed to be symmetric to each other with respect to a center region of the first terminal region TL_1. For example, the plurality of first pad terminals PAD_TL_A to the left of the center region of the first terminal region TL_1 may be inclined at an approximate 1 o'clock direction, and the plurality of first pad terminals PAD_TL_A to the right of the center region of the first terminal region TL_1 may be inclined at an approximate 11 o'clock direction.

Meanwhile, the interval between the adjacent second column sub-pad terminals ROW_PAD_B may be constant. For example, the interval between the second column sub-pad terminal ROW_PAD_B_1 and the second column sub-pad terminal ROW_PAD_B_2, the interval between the second column sub-pad terminal ROW_PAD_B_2 and the second column sub-pad terminal ROW_PAD_B_3, and the interval between the second column sub-pad terminal ROW_PAD_B_3 and the second column sub-pad terminal ROW_PAD_B_4 may be equal.

The second column sub-pad terminals ROW_PAD_B may have a substantially quadrangular shape.

In the present exemplary embodiment, the quadrangle forming each shape of the first column sub-pad terminals ROW_PAD_A and the second column sub-pad terminals ROW_PAD_B may include a first side L1 parallel to the first direction (the X-axis) and a second side L2 parallel to the second direction (the Y-axis). Here, the first side L1 and the second side L2 may be adjacent to each other.

In this case, the second side L2 may be longer than the first side L1 (L1<L2). That is, the quadrangle may have a rectangular shape that is elongated in the second direction (the Y-axis).

According to the present exemplary embodiment, if the first column sub-pad terminals ROW_PAD_A and the second column sub-pad terminals ROW_PAD_B are formed as rectangles that are elongated in the second direction, the interval between the first column sub-pad terminals ROW_PAD_A or the second column sub-pad terminals ROW_PAD_B in the first direction (the X-axis) may be reduced.

Accordingly, a number of first column sub-pad terminals ROW_PAD_A and second column sub-pad terminals ROW_ PAD_B disposed in the first terminal region TL_1 may be increased.

The plurality of first column sub-pad terminals ROW_PAD_A and the plurality of second column sub-pad terminals ROW_PAD_B may be connected by a plurality of first terminal connection lines TL_CN_A. In detail, each of the first terminal connection lines TL_CN_A may connect one among the plurality of first column sub-pad terminals ROW_ PAD_A and one among the plurality of second column sub-pad terminals ROW_PAD_B.

For example, the first column sub-pad terminal ROW_PAD_A_1 and the second column sub-pad terminal ROW_ PAD_B_1 may be connected to each other by the first terminal connection line TL_CN_A_1, and the first column sub-pad terminal ROW_PAD_A_2 and the second column sub-pad terminal ROW_PAD_B_2 may be connected to each other by the first terminal connection line TL_CN_A_2. Also, the first column sub-pad terminal ROW_ PAD_A_3 and the second column sub-pad terminal ROW_ PAD_B_3 may be connected to each other by the first terminal connection line TL_CN_A_3, and the first column sub-pad terminal ROW_PAD_A_4 and the second column sub-pad terminal ROW_PAD_B_4 may be connected to each other by the first terminal connection line TL_CN_A_4.

According to the present exemplary embodiment, the plurality of first terminal connection lines TL_CN_A may have a shape that is bent at least one time. For example, as shown in FIG. 5, the first terminal connection line TL_CN_A_1 extends from the second column sub-pad terminal ROW_PAD_B_1 to the first column sub-pad terminal ROW_PAD_A_1 along the second direction. In this case, the first terminal connection line TL_CN_A_1 may be disposed in a shape that is bent in the first direction, and then is again bent in the second direction. That is, the first terminal connection line TL_CN_A_1 may be disposed in a shape that is bent two times.

Meanwhile, a plurality of first column sub-pad terminals ROW_PAD_A may be connected to the first connection wiring CL_A. For example, the first column sub-pad terminal ROW_PAD_A_1 may be connected with the first connection wiring CL_A_1, and the first column sub-pad terminal ROW_PAD_A_2 may be connected with first connection wiring CL_A_2. The first column sub-pad terminal ROW_PAD_A_3 may be connected with the first connection wiring CL_A_3, and the first column sub-pad terminal ROW_PAD_A_4 may be connected with the first connection wiring CL_A_4.

At least one first dummy pad terminal DM_TL_A may be disposed between a pair of adjacent first column sub-pad terminals ROW_PAD_A. For example, one first dummy pad terminal DM_TL_A_1 may be disposed between the first column sub-pad terminal ROW_PAD_A_1 and the first column sub-pad terminal ROW_PAD_A_2, and one first dummy pad terminal DM_TL_A_2 may be disposed between the first column sub-pad terminal ROW_PAD_A_2 and the first column sub-pad terminal ROW_PAD_A_3. One first dummy pad terminal DM_TL_A_3 may be disposed between the first column sub-pad terminal ROW_PAD_A_3 and the first column sub-pad terminal ROW_PAD_A_4, and one first dummy pad terminal DM_TL_A_4 may be disposed close to the first column sub-pad terminal ROW_ PAD_A_4.

FIG. 5 shows that one first dummy pad terminal DM_TL_A is disposed between a pair of adjacent first column sub-pad terminals ROW_PAD_A. However, the present invention is not limited thereto, and two or more first dummy pad terminals DM_TL_A may be disposed between adjacent column sub-pad terminals.

In this case, the first column sub-pad terminals ROW_PAD_A and the first dummy pad terminals DM_TL_A may be disposed to be parallel to each other. That is, the first column sub-pad terminals ROW_PAD_A and the first dummy pad terminals DM_TL_A may all be arranged along the same line, and may be disposed to be inclined at the first inclination angle θ1 with respect to the first direction.

As at least one first dummy pad terminal DM_TL_A may be disposed between a pair of adjacent first column sub-pad terminals ROW_PAD_A, the distance between the adjacent first column sub-pad terminals ROW_PAD_A is increased such that capacitive bonding, that is, capacitive coupling generated between adjacent first column sub-pad terminals ROW_PAD_A, may be prevented.

Also, at least one second dummy pad terminal DM_TL_B may be disposed between a pair of adjacent second column sub-pad terminals ROW_PAD_B. For example, one second dummy pad terminal DM_TL_B_1 may be disposed between the second column sub-pad terminal ROW_PAD_B_1 and the second column sub-pad terminal ROW_PAD_B_2, and one second dummy pad terminal DM_TL_B_2 may be disposed between the second column sub-pad terminal ROW_PAD_B_2 and the second column sub-pad terminal ROW_PAD_B_3. One second dummy pad terminal DM_TL_B_3 may be disposed between the second column sub-pad terminal ROW_PAD_B_3 and the second column sub-pad terminal ROW_PAD_B_4, and one second dummy pad terminal DM_TL_B_4 may be disposed adjacent to the second column sub-pad terminal ROW_ PAD_B_4.

FIG. 5 shows that one second dummy pad terminal DM_TL_B is disposed between a pair of adjacent second column sub-pad terminals ROW_PAD_B. However, the present invention is not limited thereto, and two or more second dummy pad terminals DM_TL_B may be disposed between adjacent second column sub-pad terminals ROW_PAD_B.

The second column sub-pad terminals ROW_PAD_B and the second dummy pad terminals DM_TL_B may be disposed to be parallel to each other. That is, the second column sub-pad terminals ROW_PAD_B and the second dummy pad terminals DM_TL_B may all be arranged along one line, which is inclined at the second inclination angle θ2 with respect to the first direction.

In the present exemplary embodiment, as the first column sub-pad terminals ROW_PAD_A and the second column sub-pad terminals ROW_PAD_B are disposed to be inclined at the predetermined angle with respect to the first direction, many pad terminals may be disposed in a predetermined area.

Next, a structure of the second pad terminals PAD_TL_B disposed in the second terminal region TL_2 will be described with reference to FIG. 6.

Figure 6:
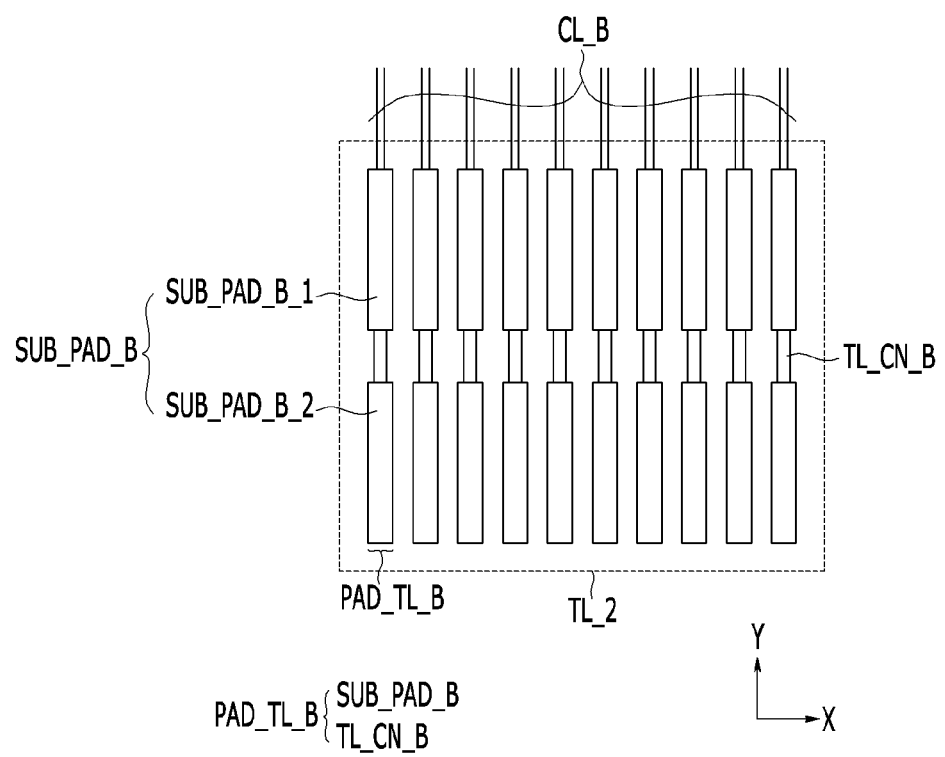
FIG. 6 is an enlarged view of a second terminal region of FIG. 1.

FIG. 6 is an enlarged view of a second terminal region of FIG. 1.

Referring to FIG. 6, a plurality of second pad terminals PAD_TL_B may be disposed in the second terminal region TL_2. In this case, the second terminal region TL_2 may be connected to power lines, for example, the driving power line ELVDDL, the common power line, the initialization power line, the scan line, and the like disposed in the display region DA through the second connection wiring CL_B. The plurality of second pad terminals PAD_TL_B may be disposed to be separated from each other at a predetermined interval in the first direction within the second terminal region TL_2.

The plurality of second pad terminals PAD_TL_B may each include a pair of second sub-pad terminals SUB_PAD_B and a second terminal connection line TL_CN_B.

A pair of second sub-pad terminals SUB_PAD_B may be disposed to be separated from each other in one direction. In the present exemplary embodiment, a pair of second sub-pad terminals SUB_PAD_B_1 and SUB_PAD_B_2 may be disposed to be separated from each other in the second direction. In this case, a pair of second sub-pad terminals SUB_PAD_B_1 and SUB_PAD_B_2 may be arranged in one line along the second direction.

The second sub-pad terminal SUB_PAD_B may be formed to have an approximate quadrangular shape. In the present exemplary embodiment, the second sub-pad terminal SUB_PAD_B may have a rectangular shape that is elongated in the second direction. In this case, the second sub-pad terminals SUB_PAD_B_1 and SUB_PAD_B_2 are each formed with a rectangular shape having long sides and short sides that are adjacent to each other, and the length of the long sides is larger than the length of the short sides by two times or more.

A pair of second sub-pad terminals SUB_PAD_B may be connected by a second terminal connection line TL_CN_B. That is, the second terminal connection lines TL_CN_B may be positioned between the second sub-pad terminals SUB_PAD_B_1 and the second sub-pad terminals SUB_PAD_B_2, so that the second sub-pad terminals SUB_PAD_B_1 and respective second sub-pad terminals SUB_PAD_B_2 may be electrically connected.

According to the present exemplary embodiment, the second terminal connection line TL_CN_B may be disposed in a straight line. Different from the above-described first terminal connection lines TL_CN_A, the second terminal connection line TL_CN_B does not have a bent shape, but may instead simply be disposed in a straight line. Accordingly, a pair of second sub-pad terminals SUB_PAD_B and the corresponding second terminal connection line TL_CN_B may be arranged in one line.

The second sub-pad terminals SUB_PAD_B_1 may be connected to the second connection wiring CL_B. Accordingly, the second sub-pad terminals SUB_PAD_B_1 may be connected to the power lines disposed in the display region DA through the second connection wiring CL_B. For example, the second sub-pad terminals SUB_PAD_B_1 may be electrically connected to the driving power line or the common power line, and the like, through the second connection wiring CL_B.

In the present exemplary embodiment, a plurality of second pad terminals PAD_TL_B is connected to the driving power line or the common power line, thereby preventing a luminance reduction of the image displayed in the display device. As described above, the second pad terminal PAD_TL_B may include a straight-shaped second terminal connection line TL_CN_B. That is, the second terminal connection line TL_CN_B is disposed as a straight line that is not bent, such that the increase in resistance of the wiring due to having a bent shape does not appear. Accordingly, as the increase in resistance of the wiring is prevented, the reduction of the luminance generated in the display device may be prevented.

Next, an exemplary variation of the second terminal region TL_2 shown in FIG. 6 will be described with reference to FIG. 7.

Figure 7:
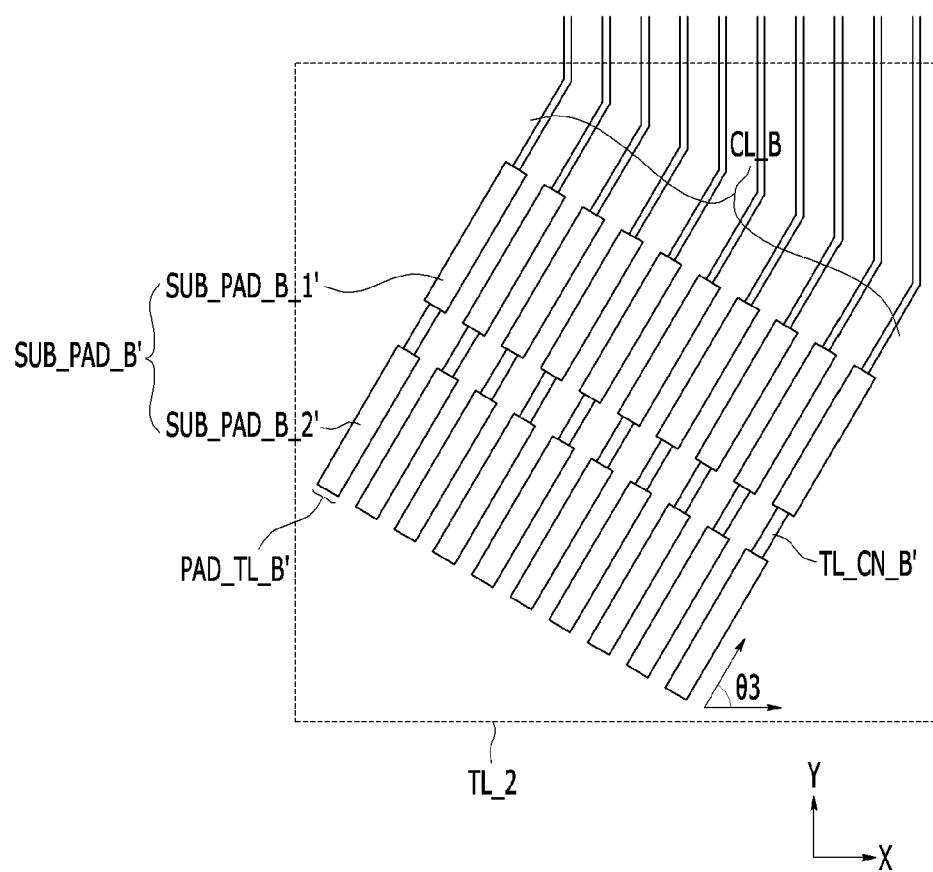
FIG. 7 is a view of an exemplary variation of a second terminal region of FIG. 6.

Referring to FIG. 7, a plurality of second pad terminals PAD_TL_B' may be disposed in the second terminal region TL_2. The plurality of second pad terminals PAD_TL_B' may respectively include a pair of second sub-pad terminals SUB_PAD_B' and a second terminal connection line TL_CN_B'.

Each pair of second sub-pad terminals SUB_PAD_B' may be disposed in one direction to be separated from each other. However, different from FIG. 6, a pair of second sub-pad terminals SUB_PAD_B_1' and SUB_PAD_B_2' may be arranged to be inclined at a third inclination angle θ3 with respect to the first direction. The third inclination angle θ3 may be in the range of 0 degrees-90 degrees (excluding 0 degrees and 90 degrees).

Meanwhile, a pair of second sub-pad terminals SUB_PAD_B' may be connected by a second terminal connection line TL_CN_B'. That is, the second terminal connection lines TL_CN_B' may be positioned between the second sub-pad terminals SUB_PAD_B_V and the second sub-pad terminals SUB_PAD_B_2'. And the second terminal connection lines TL_CN_B' may electrically connect the second sub-pad terminals SUB_PAD_B_1' and the second sub-pad terminals SUB_PAD_B_2'.

In the present exemplary variation, the second terminal connection line TL_CN_B' may be disposed with a straight shape. Accordingly, a pair of second sub-pad terminals SUB_PAD_B' and a second terminal connection line TL_CN_B' may be arranged along one line. In this case, a pair of second sub-pad terminals SUB_PAD_B' and the second terminal connection line TL_CN_B' may be arranged along a line that is inclined at the third inclination angle θ3 with respect to the first direction.

Next, the printed circuit board (PCB) 300 bonded to the display device according to an exemplary embodiment will be described with reference to FIG. 9 to FIG. 14.

Figure 9:
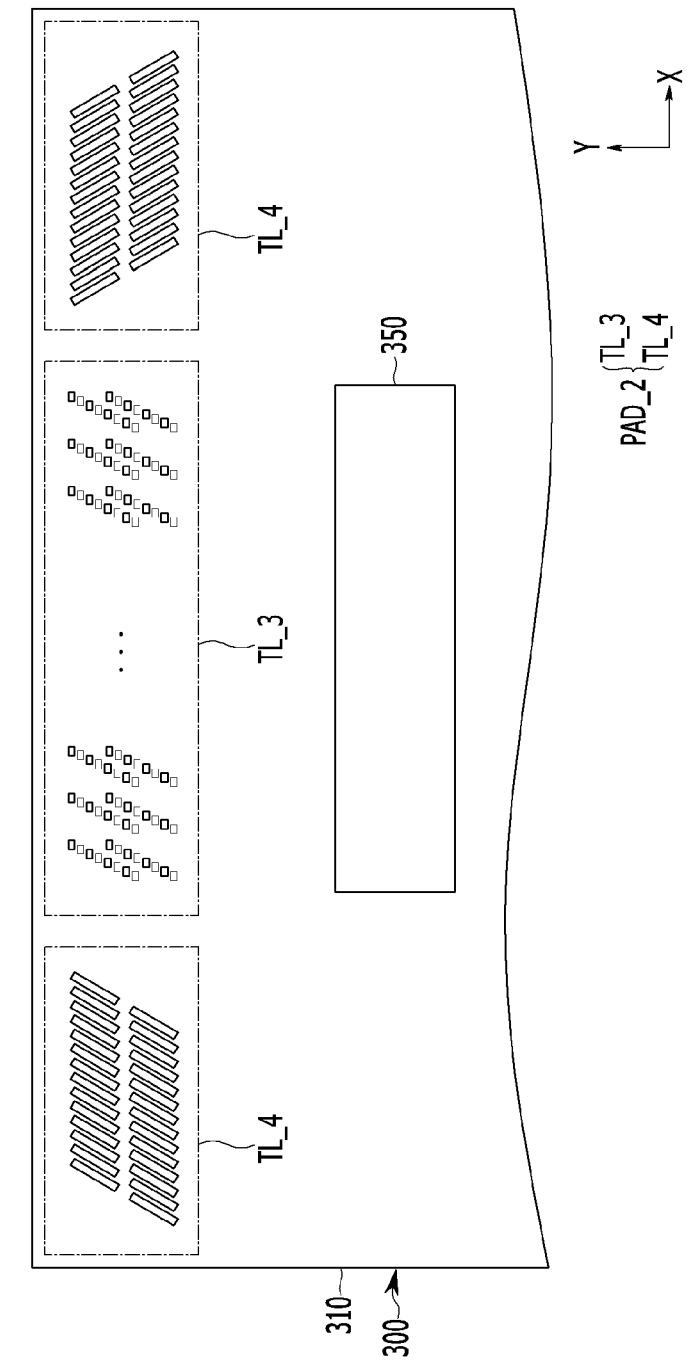
FIG. 9 is a schematic top plan view of a printed circuit board (PCB) bonded to a display device of FIG. 1.
Figure 10:
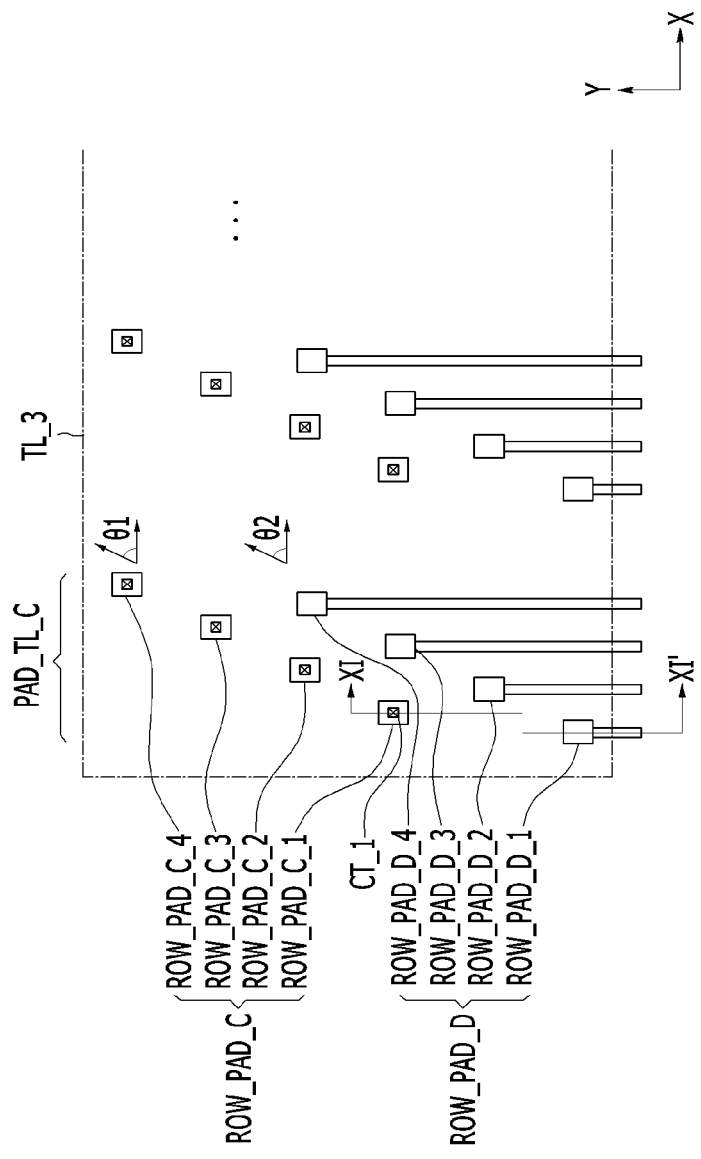
FIG. 10 is an enlarged view of a third terminal region of FIG. 9.
Figure 11:
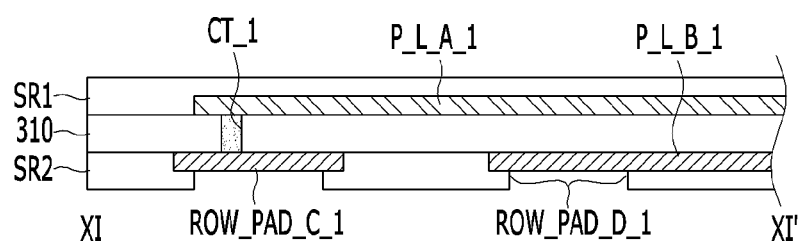
FIG. 11 is a cross-sectional view taken along a line XI-XI' of FIG. 10.
Figure 12:
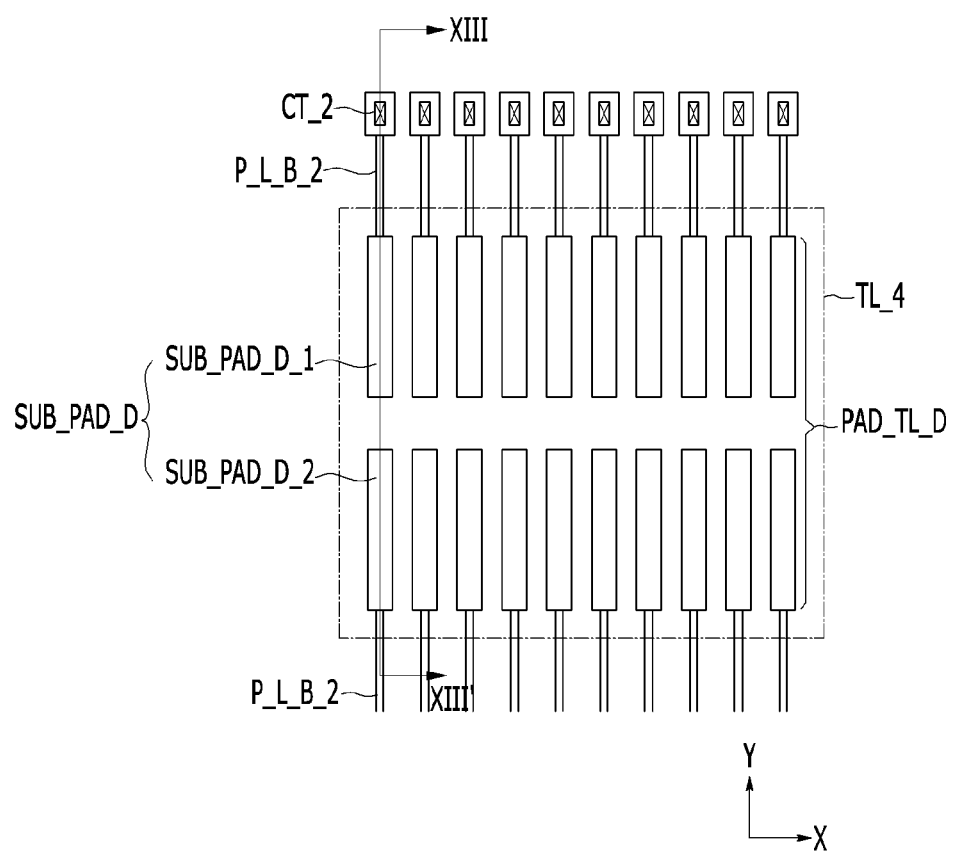
FIG. 12 is an enlarged view of a fourth terminal region of FIG. 9.
Figure 13:
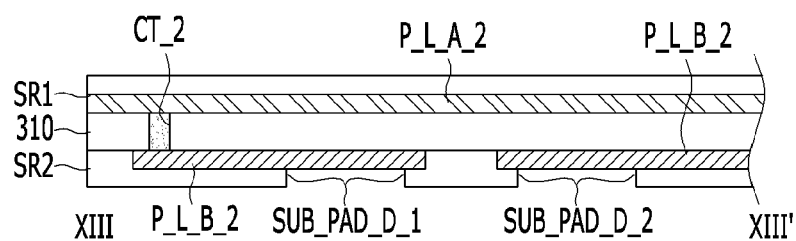
FIG. 13 is a cross-sectional view taken along a line XIII-XIII' of FIG. 12.
Figure 14:
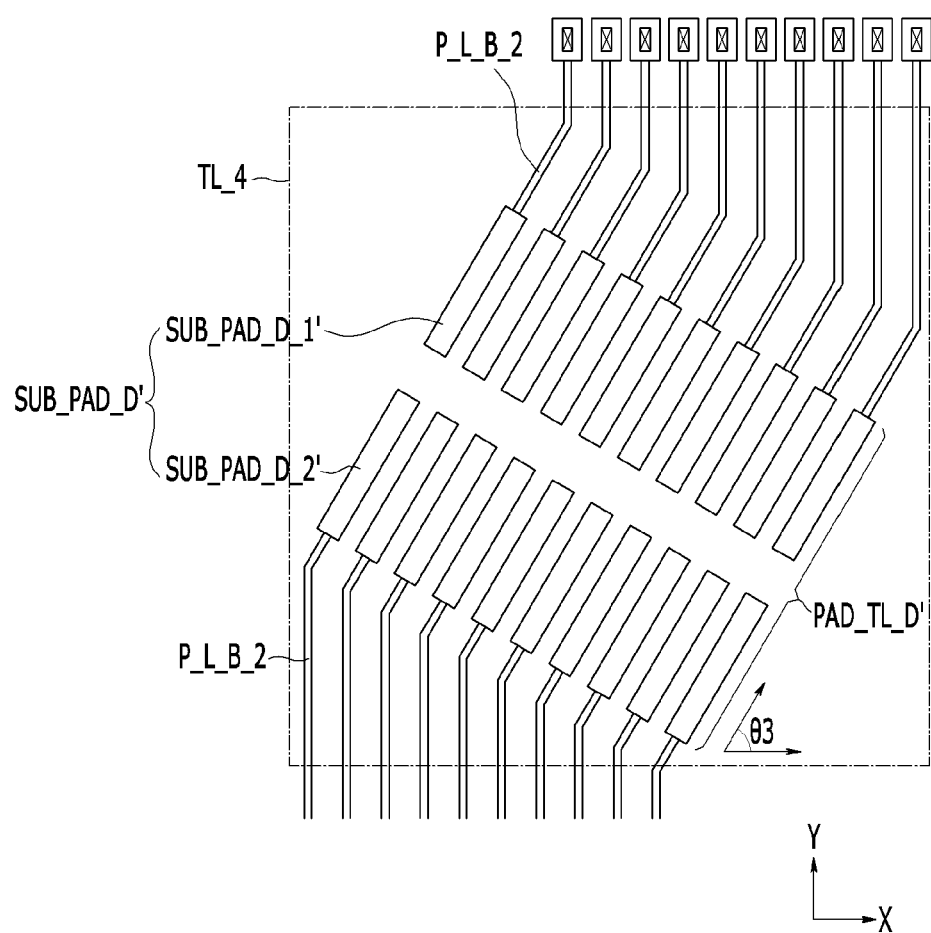
FIG. 14 is a view of an exemplary variation of a fourth terminal region of FIG. 12.

FIG. 9 is a schematic top plan view of a printed circuit board (PCB) bonded to a display device of FIG. 1, FIG. 10 is an enlarged view of a third terminal region of FIG. 9, and FIG. 11 is a cross-sectional view taken along a line XI-XI' of FIG. 10. FIG. 12 is an enlarged view of a fourth terminal region of FIG. 9, FIG. 13 is a cross-sectional view taken along a line XIII-XIII' of FIG. 12, and FIG. 14 is a view of an exemplary variation of a fourth terminal region of FIG. 12.

Referring to FIG. 9, the printed circuit board (PCB) 300 may include a flexible base film 310, a second pad unit PAD_2, and a driving chip 350.

The second pad unit PAD_2 may be disposed at one end of the base film 310. According to the present exemplary embodiment, the second pad unit PAD_2 may be made with a shape corresponding to the shape of the above-described first pad unit PAD_1 of the substrate SUB. As the second pad unit PAD_2 of the printed circuit board (PCB) 300 and the first pad unit PAD_1 of the substrate SUB may be formed with shapes corresponding to each other, the first pad unit PAD_1 and the second pad unit PAD_2 may be more easily bonded.

The second pad unit PAD_2 may include a third terminal region TL_3 and a fourth terminal region TL_4. The third terminal region TL_3 and the fourth terminal region TL_4 represent regions positioned on the base film 310. The third terminal region TL_3 and the fourth terminal region TL_4 may be arranged in parallel along the first direction on the base film 310.

According to the present exemplary embodiment, the fourth terminal region TL_4 may be disposed at both sides of the third terminal region TL_3. However, the present invention is not limited thereto, and the fourth terminal region TL_4 may instead be disposed between a pair of third terminal regions TL_3.

The arrangement of the third terminal region TL_3 and the fourth terminal region TL_4 is determined depending on the arrangement of the first terminal region TL_1 and the second terminal region TL_2 disposed on the substrate SUB. For example, if the second terminal region TL_2 is disposed at both sides of the first terminal region TL_1, the fourth terminal region TL_4 may be disposed at both sides of the third terminal region TL_3. Further, if the second terminal region TL_2 is disposed between a pair of first terminal regions TL_1, the fourth terminal region TL_4 may be disposed between a pair of third terminal regions TL_3.

Referring to FIG. 10 and FIG. 11, the third terminal region TL_3 is a region corresponding to the first terminal region TL_1 of the substrate SUB, and a plurality of third pad terminals PAD_TL_C may be disposed in the third terminal region TL_3.

The plurality of third pad terminals PAD_TL_C may be disposed in the same pattern as the first pad terminals PAD_TL_A disposed in the above-described first terminal region TL_1. That is, the plurality of third pad terminals PAD_TL_C of the third terminal region TL_3 may be formed with a third pattern corresponding to the above-described first pattern.

The plurality of third pad terminals PAD_TL_C may include third column sub-pad terminals ROW_PAD_C and fourth column sub-pad terminals ROW_PAD_D.

In the present exemplary embodiment, the third column sub-pad terminals ROW_PAD_C may be disposed along one direction to be separated from each other. In this case, the third column sub-pad terminals ROW_PAD_C may form the first inclination angle $\theta 1$ with respect to the first direction. The third column sub-pad terminals ROW_PAD_C may be arranged to be inclined at the first inclination angle $\theta 1$ with respect to the first direction. That is, the third column sub-pad terminals ROW_PAD_C may be arranged to be inclined at the same angle as the first column sub-pad terminals ROW_PAD_A of the substrate SUB. In this case, the first inclination angle $\theta 1$ may be in the range of 0 degrees-90 degrees (excluding 0 degrees and 90 degrees).

Further, the interval between adjacent third column sub-pad terminals ROW_PAD_C may be constant. For example, the interval between the third column sub-pad terminal ROW_PAD_C_1 and the third column sub-pad terminal ROW_PAD_C_2, the interval between the third column sub-pad terminal ROW_PAD_C_2 and the third column sub-pad terminal ROW_PAD_C_3, and the interval between the third column sub-pad terminal ROW_PAD_C_3 and the third column sub-pad terminal ROW_PAD_C_4 may be equal. In this case, adjacent third column sub-pad terminals ROW_PAD_C may be arranged at an interval that is equal to the interval between the above-described first column sub-pad terminals ROW_PAD_A.

The third column sub-pad terminals ROW_PAD_C may be formed with an approximate quadrangular shape.

The fourth column sub-pad terminals ROW_PAD_D may be disposed to be separated from the third column sub-pad terminals ROW_PAD_C in the second direction. Like the third column sub-pad terminals ROW_PAD_C, the fourth column sub-pad terminals ROW_PAD_D may be disposed to be separated from each other in one direction.

In this case, the fourth column sub-pad terminals ROW_PAD_D may form the second inclination angle $\theta 2$ with respect to the first direction. That is, the fourth column sub-pad terminals ROW_PAD_D may be arranged along a line that is inclined at the second inclination angle $\theta 2$ with respect to the first direction. That is, the fourth column sub-pad terminals ROW_PAD_D may be arranged to be inclined at the same angle as the second column sub-pad terminals ROW_PAD_B of the substrate SUB. In this case, the second inclination angle $\theta 2$ may be in the range of 0 degrees-90 degrees (excluding 0 degrees and 90 degrees).

In the present exemplary embodiment, like the first column sub-pad terminals ROW_PAD_A and the second column sub-pad terminals ROW_PAD_B of the substrate SUB, the first inclination angle $\theta 1$ and the second inclination angle $\theta 2$ may be equal to each other. Accordingly, the third column sub-pad terminals ROW_PAD_C and the fourth column sub-pad terminals ROW_PAD_D may be arranged to be inclined at the same angle with respect to the first direction.

However, the present invention is not limited thereto, and the first inclination angle $\theta 1$ and the second inclination angle $\theta 2$ may be different from each other. Accordingly, the third column sub-pad terminals ROW_PAD_C and the fourth column sub-pad terminals ROW_PAD_D may be arranged to be inclined at different angles with the first direction.

Meanwhile, the intervals between the adjacent fourth column sub-pad terminals ROW_PAD_D may be equal to each other. For example, the interval between the fourth column sub-pad terminal ROW_PAD_D_1 and the fourth column sub-pad terminal ROW_PAD_D_2, the interval between the fourth column sub-pad terminal ROW_PAD_D_2 and the fourth column sub-pad terminal ROW_PAD_D_3, and the interval between the fourth column sub-pad terminal ROW_PAD_D_3 and the fourth column sub-pad terminal ROW_PAD_D_4 may be equal.

The fourth column sub-pad terminals ROW_PAD_D may be formed to have an approximate quadrangular shape.

Meanwhile, the first terminal wiring P_L_A_1 and the second terminal wiring P_L_B_1 may be positioned at opposing sides of the base film 310 in the printed circuit board (PCB). The first terminal wiring P_L_A_1 may be positioned on or over the base film 310, and the second terminal wiring P_L_B_1 may be positioned under the base film 310. In this case, the first terminal wiring P_L_A_1 and the second terminal wiring P_L_B_1 may be electrically connected to the driving chip 350, respectively.

A first protection layer SR1 may be disposed on the first terminal wiring P_L_A_1, and a second protection layer SR2 may be disposed on the second terminal wiring P_L_B_1. In this case, the first protection layer SR1 and the second protection layer SR2 may each be a solder resist.

The third column sub-pad terminal ROW_PAD_C_1 and the fourth column sub-pad terminal ROW_PAD_D_1 may be formed of the same layer as the second terminal wiring P_L_B_1. For the third column sub-pad terminal ROW_PAD_C_1 and the fourth column sub-pad terminal ROW_PAD_D_1, a part of the second protection layer SR2 is removed such that a part of the second terminal wiring P_L_B_1 may be exposed. In this case, the third column sub-pad terminal ROW_PAD_C_1 and the fourth column sub-pad terminal ROW_PAD_D_1 are separated from each other.

In this case, the third column sub-pad terminal ROW_PAD_C_1 may be electrically connected to the first terminal wiring P_L_A_1 through a first contact hole CT_1 formed in the base film 310. In a plan view, the first contact hole CT_1 may be disposed to overlap the third column sub-pad terminal ROW_PAD_C_1. In the present case, the first contact hole CT_1 is filled with the same metal as the first terminal wiring P_L_A_1, but may instead be filled with the metal of the third column sub-pad terminal ROW_PAD_C_1.

Meanwhile, the fourth column sub-pad terminal ROW_PAD_D_1 may be formed of the same metal layer as the second terminal wiring P_L_B_1. In the present exemplary embodiment, the fourth column sub-pad terminal ROW_PAD_D_1 may correspond to a region where a part of the second terminal wiring P_L_B_1 is exposed.

Referring to FIG. 12 and FIG. 13, the fourth terminal region TL_4 is a region corresponding to the second terminal region TL_2 of the substrate SUB, and a plurality of fourth pad terminals PAD_TL_D may be disposed in the fourth terminal region TL_4.

The plurality of fourth pad terminals PAD_TL_D may be disposed in the same pattern as the second pad terminals PAD_TL_B disposed in the above-described second terminal region TL_2. That is, the plurality of fourth pad terminals PAD_TL_D of the fourth terminal region TL_4 may be formed in the fourth pattern corresponding to the above-described second pattern.

The plurality of fourth pad terminals PAD_TL_D may respectively include a pair of fourth sub-pad terminals SUB_PAD_D.

Each pair of fourth sub-pad terminals SUB_PAD_D may be disposed in one direction to be separated from each other. In the present exemplary embodiment, a pair of fourth sub-pad terminals SUB_PAD_D_1 and SUB_PAD_D_2 may be disposed along the second direction to be separated from each other. In this case, a pair of fourth sub-pad terminals SUB_PAD_D_1 and SUB_PAD_D_2 may be disposed in one line along the second direction.

The fourth sub-pad terminal SUB_PAD_D may be made to have an approximate quadrangular shape. In the present exemplary embodiment, the fourth sub-pad terminal SUB_PAD_D may have a rectangular shape that is elongated in the second direction. In this case, the fourth sub-pad terminals SUB_PAD_D_1 and SUB_PAD_D_2 have a rectangular shape having adjacent long sides and short sides, and the length of the long sides is larger than the length of the short sides by two times or more.

The fourth sub-pad terminals SUB_PAD_D_1 and SUB_PAD_D_2 may be formed of the same layer as the second terminal wiring P_L_B_2. For the fourth sub-pad terminals SUB_PAD_D_1 and SUB_PAD_D_2, part of the second protection layer SR2 is removed such that parts of the second terminal wiring P_L_B_1 are exposed. In this case, the fourth sub-pad terminals SUB_PAD_D_1 and SUB_PAD_D_2 are separated from each other.

Meanwhile, like the third terminal region TL_3, the first terminal wiring P_L_A_2 and the second terminal wiring P_L_B_2 may be positioned at opposing sides of the base film 310 in the printed circuit board (PCB). The first terminal wiring P_L_A_2 may be positioned on the base film 310, and the second terminal wiring P_L_B_2 may be positioned under the base film 310. In this case, the first terminal wiring P_L_A_2 and the second terminal wiring P_L_B_2 may be respectively and electrically connected to the driving chip 350.

In this case, the fourth sub-pad terminal SUB_PAD_D_1 may be electrically connected to the first terminal wiring P_L_A_2 through the second contact hole CT_2 formed in the base film 310. In a plan view, the fourth sub-pad terminal SUB_PAD_D_1 and the second contact hole CT_2 are arranged to not overlap each other. The second terminal wiring P_L_B_2 may be formed extend in the second direction from the fourth sub-pad terminal SUB_PAD_D_1. Also, the second contact hole CT_2 may overlap the second terminal wiring P_L_B_2. In this case, the same metal as that of the first terminal wiring P_L_A_2 may be filled in the second contact hole CT_2, or the metal configuring the fourth sub-pad terminal SUB_PAD_D_1 may be filled therein.

Meanwhile, the fourth sub-pad terminal SUB_PAD_D_2 may be formed of the same metal layer as the second terminal wiring P_L_B_2. In the present exemplary embodiment, the fourth sub-pad terminal SUB_PAD_D_2 may correspond to a region where part of the second terminal wiring P_L_B_2 is exposed.

Next, an exemplary variation of the fourth terminal region TL_4 shown in FIG. 12 will be described with reference to FIG. 14.

Referring to FIG. 14, a plurality of fourth pad terminals PAD_TL_D' may be disposed in the fourth terminal region TL_4. Each of a plurality of fourth pad terminals PAD_TL_D' may include a pair of fourth sub-pad terminals SUB_PAD_D'.

A pair of fourth sub-pad terminals SUB_PAD_D' may be disposed in one direction to be separated from each other. However, differently from FIG. 12, a pair of fourth sub-pad terminals SUB_PAD_D_1' and SUB_PAD_D_2' may be arranged at the third inclination angle θ3 with the first direction. The third inclination angle θ3 formed by the fourth sub-pad terminals SUB_PAD_D_V and SUB_PAD_D_2' of FIG. 14 may be the same as the angle formed by the second sub-pad terminal SUB_PAD_D' formed on the substrate SUB of FIG. 7.

Next, an exemplary variation of the printed circuit board (PCB) will be described with reference to FIG. 15 and FIG. 16.

Figure 15:
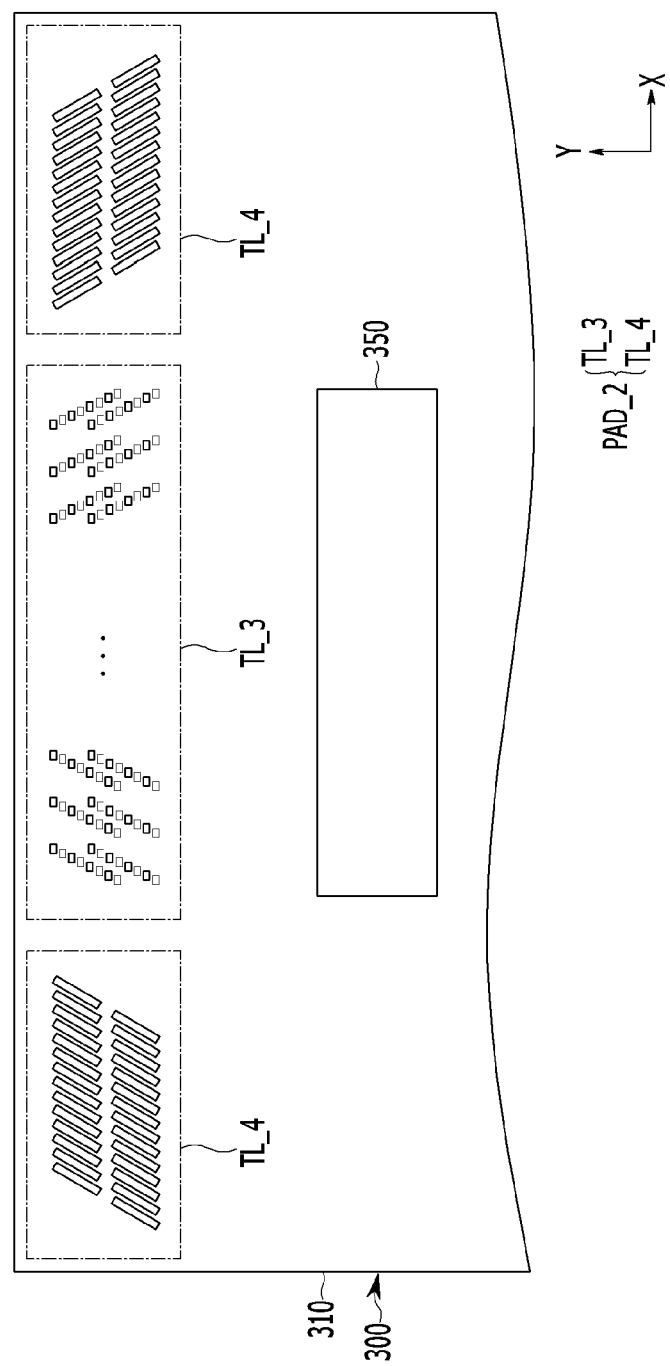
FIG. 15 is a view of a first exemplary variation of a printed circuit board (PCB) of FIG. 9.
Figure 16:
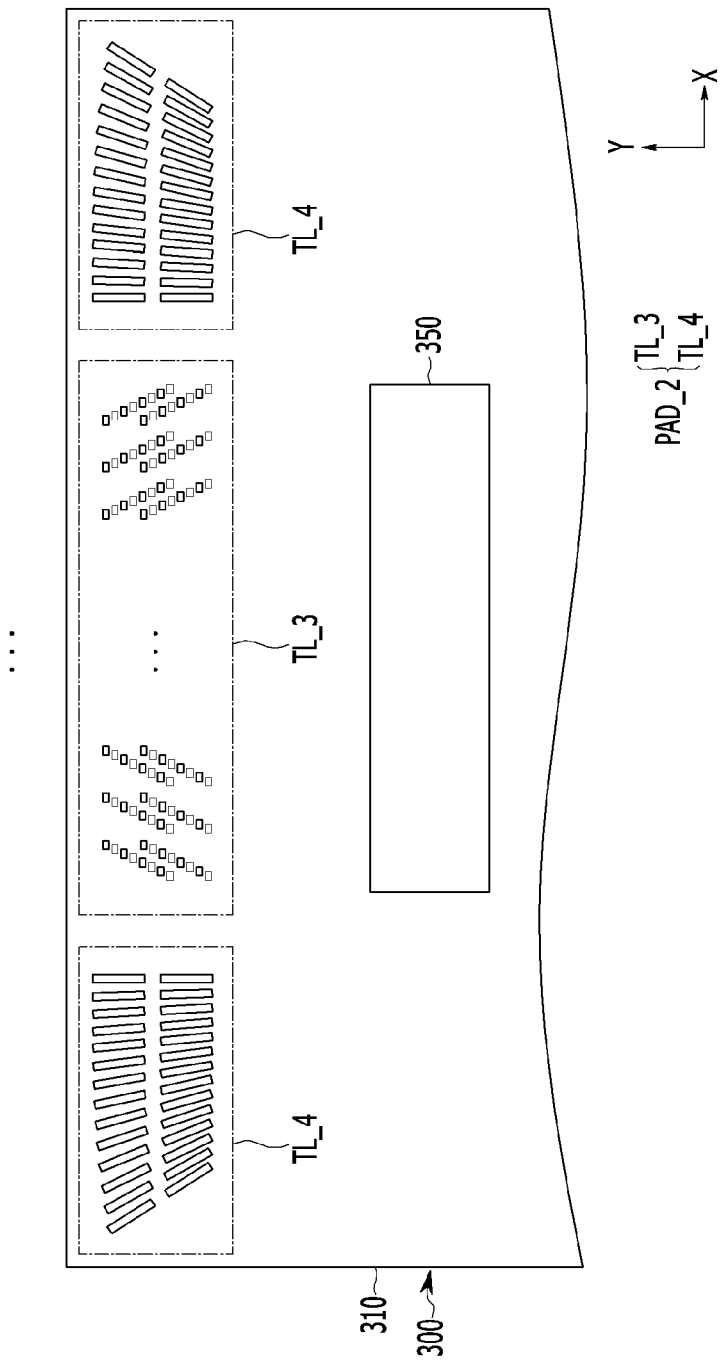
FIG. 16 is a view of a second exemplary variation of a printed circuit board (PCB) of FIG. 9.

FIG. 15 is a view of a first exemplary variation of the printed circuit board (PCB) of FIG. 9, and FIG. 16 is a view of a second exemplary variation of the printed circuit board (PCB) of FIG. 9.

In FIG. 9, the plurality of third pad terminals PAD_TL_C of the third terminal region TL_3 may be disposed with the same pattern as the first pad terminals PAD_TL_A disposed in the first terminal region TL_1 of FIG. 1. The plurality of third pad terminals PAD_TL_C may be disposed to be inclined at the same angle within the third terminal region TL_3. That is, the plurality of third pad terminals PAD_TL_C may be inclined in the approximate 1 o'clock direction.

However, in the first exemplary variation of the printed circuit board (PCB) of FIG. 15, the plurality of third pad terminals PAD_TL_C of the third terminal region TL_3 may be disposed with the same pattern as the first pad terminals PAD_TL_A disposed in the first terminal region TL_1 of FIG. 8.

The plurality of third pad terminals PAD_TL_C of the third terminal region TL_3 may be disposed to be symmetric to each other with respect to the center region of the third terminal region TL_3. For example, the plurality of third pad terminals PAD_TL_C to the left of the center region of the third terminal region TL_3 may be inclined in the approximate 1 o'clock direction, and the plurality of third pad terminals PAD_TL_C to the right of the center region of the third terminal region TL_3 may be inclined in the approximate 11 o'clock direction.

Referring to FIG. 16, the plurality of fourth pad terminals PAD_TL_D disposed in the fourth terminal region TL_4 may be disposed at different angles with respect to the first direction (the X-axis). For example, in the fourth terminal region TL_4 positioned at the right side of the third terminal region TL_3, the angle of the fourth pad terminals PAD_TL_D with respect to the X-axis may gradually decrease from the left side to the right side. In contrast, in the fourth terminal region TL_4 positioned at the right side of the third terminal region TL_3, the angle of the fourth pad terminals PAD_TL_D with respect to the X-axis may gradually increase from the left side to the right side.

Alternatively, in the fourth terminal region TL_4 positioned at the left side of the third terminal region TL_3, the angle of the fourth pad terminals PAD_TL_D with respect to the X-axis may gradually decrease from the right side to the left side. Likewise, in the fourth terminal region TL_4 positioned at the left side of the third terminal region TL_3, the angle of the fourth pad terminals PAD_TL_D with respect to the X-axis may gradually increase from the right side to the left side.

Next, a state in which the second terminal region TL_2 and the fourth terminal region TL_4 are bonded to each other will be described with reference to FIG. 17 and FIG. 18.

Figure 17:
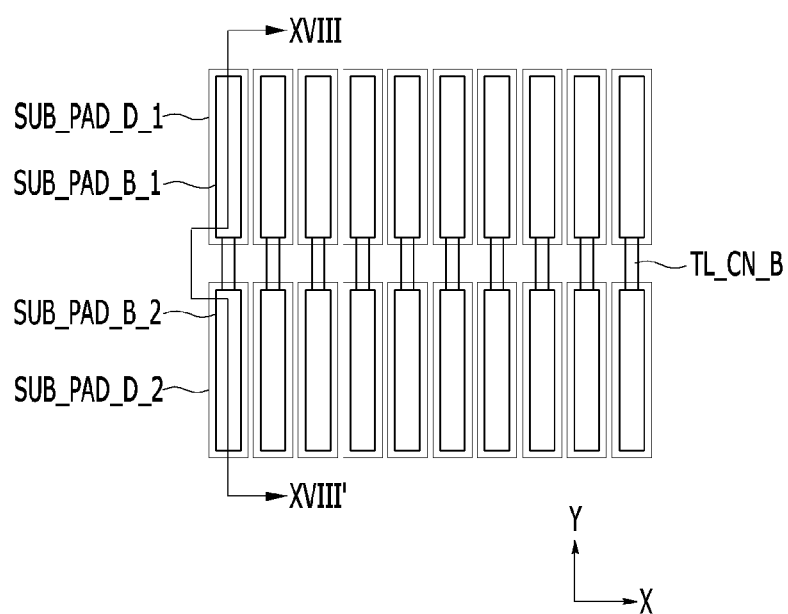
FIG. 17 is a view schematically showing a state in which a second terminal region formed in a substrate and a fourth terminal region formed in a printed circuit board (PCB) are bonded.
Figure 18:
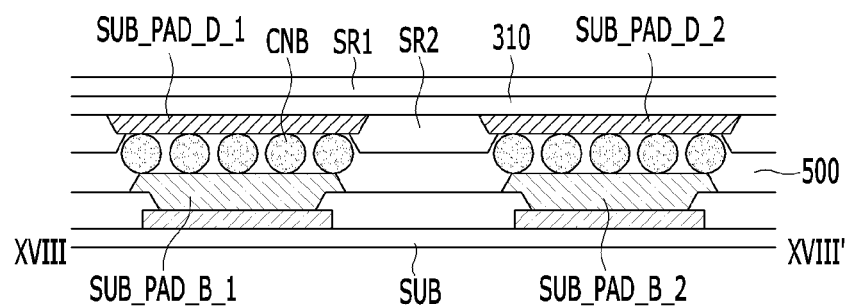
FIG. 18 is a cross-sectional view taken along a line XVIII-XVIII' of FIG. 17.

FIG. 17 is a view schematically showing a state in which a second terminal region formed in a substrate and a fourth terminal region formed in a printed circuit board (PCB) are bonded, and FIG. 18 is a cross-sectional view taken along a line XVIII-XVIII' of FIG. 17.

When the printed circuit board (PCB) 300 is bonded to the pad region PNL_PAD of the substrate SUB, the second sub-pad terminals SUB_PAD_B_1 and SUB_PAD_B_2 of the second terminal region TL_2, and the fourth sub-pad terminals SUB_PAD_D_1 and SUB_PAD_D_2 of the fourth terminal region TL_4, may be disposed to overlap each other.

In detail, the fourth sub-pad terminal SUB_PAD_D_1 is disposed to overlap the second sub-pad terminal SUB_PAD_B_1, and the fourth sub-pad terminal SUB_PAD_D_2 is disposed to overlap the second sub-pad terminal SUB_PAD_B_2.

Next, a conductive adhesive film 500 may be disposed between the second terminal region TL_2 and the fourth terminal region TL_4. The conductive adhesive film 500 electrically connects the second sub-pad terminals SUB_PAD_B_1 and SUB_PAD_B_2 to the fourth sub-pad terminals SUB_PAD_D_1 and SUB_PAD_D_2. The second sub-pad terminals SUB_PAD_B_1 and SUB_PAD_B_2 and the fourth sub-pad terminals SUB_PAD_D_1 and SUB_PAD_D_2 may be electrically connected through a plurality of conductive balls CNB included in the conductive adhesive film 500.

Next, a state in which the first terminal region TL_1 and the third terminal region TL_3 are bonded to each other will be described with reference to FIG. 19 and FIG. 20.

Figure 19:
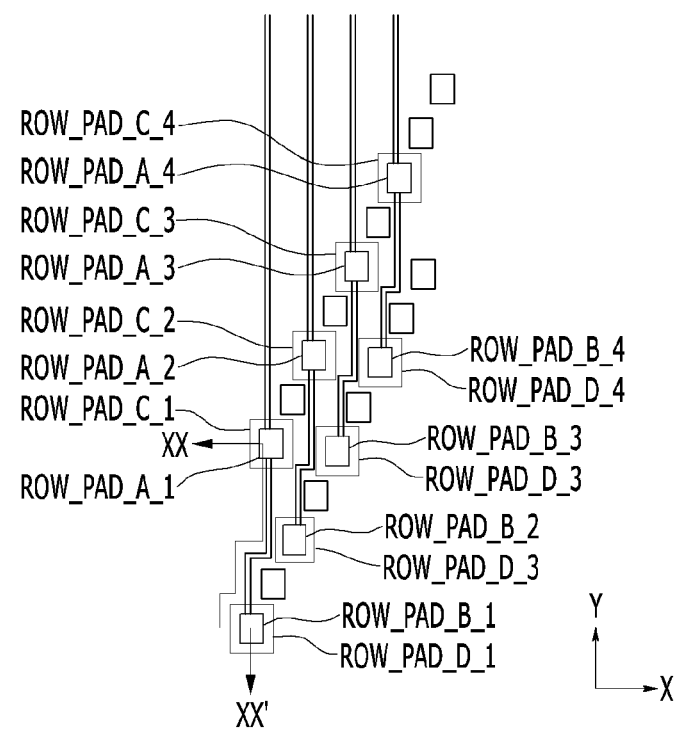
FIG. 19 is a view schematically showing a state in which a second terminal region formed in a substrate and a third terminal region formed in a printed circuit board (PCB) are bonded.
Figure 20:
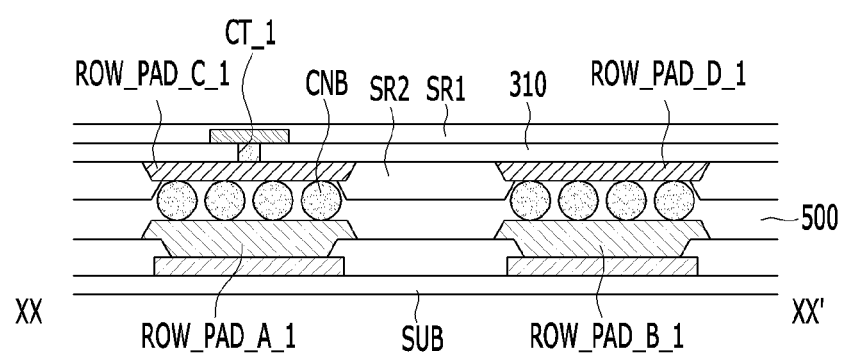
FIG. 20 is a cross-sectional view taken along a line XX-XX' of FIG. 19.

FIG. 19 is a view schematically showing a state in which a second terminal region formed in a substrate and a third terminal region formed in a printed circuit board (PCB) are bonded, and FIG. 20 is a cross-sectional view taken along a line XX-XX' of FIG. 19.

The third pad terminals PAD_TL_C (referring to FIG. 10) may be disposed to overlap the first pad terminals PAD_TL_A (referring to FIG. 5). In detail, the third column sub-pad terminals ROW_PAD_C may overlap and be disposed on the first column sub-pad terminals ROW_PAD_A, and the fourth column sub-pad terminals ROW_PAD_D may overlap and be disposed on the second column sub-pad terminals ROW_PAD_B.

Also, the conductive adhesive film 500 may be disposed between the first terminal region TL_1 and the third terminal region TL_3. The conductive adhesive film 500 may electrically connect the first column sub-pad terminals ROW_PAD_A and the third column sub-pad terminals ROW_PAD_C. The first column sub-pad terminals ROW_PAD_A and the third column sub-pad terminals ROW_PAD_C may be electrically connected to each other through the plurality of conductive balls CNB included in the conductive adhesive film 500.

In the display device according to an exemplary embodiment, the first terminal region TL_1 and the second terminal region TL_2 are formed in the first pad unit PAD_1, and in this case, the plurality of first pad terminals PAD_TL_A disposed in the first terminal region TL_1 and the plurality of second pad terminals PAD_TL_B disposed in the second terminal region TL_2 may have different patterns from each other.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Various features of the above described and other embodiments can thus be mixed and matched in any manner, to produce further embodiments consistent with the invention.

DESCRIPTION OF SYMBOLS

SUB substrate
DA display region
PNL_PAD pad region
PAD_1 first pad unit
PAD_2 second pad unit
TL_1 first terminal region
TL_2 second terminal region
TL_3 third terminal region
TL_4 fourth terminal region
PAD_TL_A first pad terminal
PAD_TL_B second pad terminal
PAD_TL_C third pad terminal
PAD_TL_D fourth pad terminal
TL_CN_A first terminal connection lines
ROW_PAD_A first column sub-pad terminals
ROW_PAD_B second column sub-pad terminals
DM_TL_A first dummy pad terminal
DM_TL_B second dummy pad terminal
SUB_PAD_B second sub-pad terminal
TL_CN_B second terminal connection line
300 printed circuit board (PCB)
310 base film
350 driving chip
SR1 first protection layer
SR2 second protection layer CT_1 first contact hole
CT_2 second contact hole
500 conductive adhesive film
CNB conductive ball

What is claimed is:

1. A display device comprising:
a substrate including a display region configured to display an image, and a pad region positioned around the display region; and
a first pad unit positioned on the pad region,
wherein the first pad unit includes:
   a first terminal region including a plurality of first pad terminals arranged in a first pattern, and
   a second terminal region including a plurality of second pad terminals arranged in a second pattern different from the first pattern,
wherein the plurality of first pad terminals includes:
a plurality of first column sub-pad terminals arranged substantially along a first line forming a first inclination angle with a first direction;
a plurality of second column sub-pad terminals arranged substantially along a second line and separated from the plurality of first column sub-pad terminals, the second line forming a second inclination angle with the first line; and
a plurality of first terminal connection lines each connecting one among the plurality of first column sub-pad terminals and one among the plurality of second column sub-pad terminals, and each first terminal connection line having a shape with at least one bend,
wherein the first inclination angle ($\theta1$) and the second inclination angle ($\theta2$) are each between more than 0 degrees and less than 90 degrees.

2. The display device of claim 1, wherein
the first inclination angle and the second inclination angle are substantially equal.

3. The display device of claim 2, wherein
the first inclination angle and the second inclination angle are each between 0 degrees and 90 degrees.

4. The display device of claim 1, wherein
a plurality of first column sub-pad terminals and a plurality of second column sub-pad terminals each have a quadrangular shape.

5. The display device of claim 4, wherein
the quadrangular shape includes a first side parallel to the first direction and a second side adjacent to the first side and parallel to a second direction perpendicular to the first direction, and
the second side is longer than the first side.

6. The display device of claim 1, wherein
at least one first dummy pad terminal is disposed between a pair of adjacent first column sub-pad terminals.

7. The display device of claim 6, wherein
the first column sub-pad terminals and at least one first dummy pad terminal are arranged along a same line.

8. The display device of claim 6, wherein
at least one second dummy pad terminal is disposed between a pair of adjacent second column sub-pad terminals.

9. The display device of claim 8, wherein
the second column sub-pad terminals and at least one second dummy pad terminal are arranged along a same line.

10. The display device of claim 1, wherein
the second terminal region includes two regions disposed at two sides of the first terminal region.

11. The display device of claim 1, wherein
the first terminal region includes two regions disposed at two sides of the second terminal region.

12. The display device of claim 1, wherein the plurality of second pad terminals respectively includes:
a pair of second sub-pad terminals separated from each other, and
a substantially straight second terminal connection line connecting the pair of second sub-pad terminals to each other.

13. The display device of claim 12, wherein
the pair of second sub-pad terminals is arranged along one line.

14. The display device of claim 13, wherein
the pair of second sub-pad terminals is arranged along a second direction perpendicular to the first direction.

15. The display device of claim 13, wherein
the pair of second sub-pad terminals are arranged along a line oriented at a third inclination angle with respect to the first direction.

16. The display device of claim 15, wherein
the third inclination angle is between 0 degrees and 90 degrees (excluding 0 degrees and 90 degrees).

17. The display device of claim 12, further comprising:
a base film; and
a printed circuit board (PCB) positioned at one side of the base film and including a second pad unit with a shape corresponding to the first pad unit and bonded to the first pad unit.

18. The display device of claim 17, wherein the second pad unit includes:
a third terminal region including a plurality of third pad terminals arranged in a third pattern corresponding to the first pattern, and
a fourth terminal region including a plurality of fourth pad terminals arranged in a fourth pattern corresponding to the second pattern.

19. The display device of claim 18, wherein the plurality of third pad terminals respectively includes:
a plurality of third column sub-pad terminals arranged substantially along a third line forming the first inclination angle with the first direction, and
a plurality of fourth column sub-pad terminals separated from the plurality of third column sub-pad terminals, and arranged substantially along a fourth line forming the second inclination angle with the first direction.

20. The display device of claim 19, wherein
the fourth terminal region is positioned at both sides of the third terminal region.

21. The display device of claim 19, wherein
the fourth terminal region is positioned between a pair of the third terminal regions.

22. The display device of claim 18, wherein
the plurality of fourth pad terminals respectively include a pair of fourth sub-pad terminals separated from each other.

23. The display device of claim 22, wherein
the pair of fourth sub-pad terminals is arranged along one line.

24. The display device of claim 23, wherein
the one line forms a third inclination angle with the first direction.

25. The display device of claim 17, wherein
the printed circuit board (PCB) further includes a driving chip positioned at another side of the base film, the another side of the base film being different from the one side of the base film.

26. The display device of claim 19, wherein the base film is flexible.

27. The display device of claim 1, wherein the first pad terminals are connected to respective ones of data lines disposed in the display region.

28. The display device of claim 1, wherein the second pad terminals are respectively connected to power lines disposed in the display region.

29. The display device of claim 28, wherein the power lines include at least one among a driving voltage line, a common power line, an initialization power line, and a gate line.

\* \* \* \* \*